(12) United States Patent
Lee et al.

(10) Patent No.: US 12,369,440 B2
(45) Date of Patent: Jul. 22, 2025

(54) SEMICONDUCTOR LIGHT EMITTING DEVICE AND LIGHT EMITTING DEVICE ASSEMBLY INCLUDING THE SAME

(71) Applicant: SAMSUNG ELECTRONICS CO., LTD., Suwon-si (KR)

(72) Inventors: Sungwook Lee, Seoul (KR); Sumin Hwangbo, Hwaseong-si (KR); Sanghyun Kim, Goyang-si (KR); Yujung Kim, Osan-si (KR); Jungwook Lee, Yongin-si (KR); Minwook Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 455 days.

(21) Appl. No.: 17/979,463

(22) Filed: Nov. 2, 2022

(65) Prior Publication Data
US 2023/0253535 A1  Aug. 10, 2023

(30) Foreign Application Priority Data
Feb. 10, 2022 (KR) .......................... 10-2022-0017774

(51) Int. Cl.
  *H01L 33/50* (2010.01)
  *H10H 20/814* (2025.01)
  (Continued)

(52) U.S. Cl.
  CPC ...... *H10H 20/8514* (2025.01); *H10H 20/814* (2025.01); *H10H 20/8312* (2025.01); *H10H 20/857* (2025.01); *H10H 29/142* (2025.01)

(58) Field of Classification Search
None
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| (Continued) | | |

FOREIGN PATENT DOCUMENTS

| JP | 2021-22688 A | 2/2021 |
| KR | 10-2021-0041621 A | 4/2021 |
| (Continued) | | |

*Primary Examiner* — William C Trapanese
(74) *Attorney, Agent, or Firm* — Sughrue Mion, PLLC

(57) ABSTRACT

Provided is a semiconductor light emitting device including a base layer, a light emitting structure including a first semiconductor layer having a first conductivity, an active layer, and a second semiconductor layer having a second conductivity different from the first conductivity, a wavelength converting layer on the light emitting structure, a separation wall disposed adjacent to side surfaces of the wavelength converting layer, a first electrode metal layer on a lower surface of the first semiconductor layer, the first electrode metal layer including a reflection structure, and a second electrode metal layer electrically connected to the second semiconductor layer via through holes penetrating the first electrode metal layer, the first semiconductor layer, and the active layer, and exposing the second semiconductor layer, wherein the semiconductor light emitting device is configured to implement gradation in a first direction based on adjusting at least one of the light emitting structure on an upper surface of the second semiconductor layer, the reflection structure, the separation wall, and a structure included in the light emitting structure.

20 Claims, 25 Drawing Sheets

(51) Int. Cl.
*H10H 20/831* (2025.01)
*H10H 20/851* (2025.01)
*H10H 20/857* (2025.01)
*H10H 29/14* (2025.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,702,285 B2 | 4/2014 | Harada et al. |
| 8,735,931 B2 | 5/2014 | Han et al. |
| 8,766,295 B2 | 7/2014 | Kim |
| 9,653,657 B2 | 5/2017 | Yamaguchi et al. |
| 10,461,120 B2 | 10/2019 | von Malm |
| 11,060,689 B2 | 7/2021 | Kwon et al. |
| 2016/0056352 A1 | 2/2016 | Koike et al. |
| 2020/0287076 A1 | 9/2020 | Choi et al. |
| 2021/0143300 A1 | 5/2021 | Kim et al. |
| 2021/0366980 A1 | 11/2021 | Lee et al. |
| 2021/0366982 A1 | 11/2021 | Lee et al. |
| 2021/0367121 A1 | 11/2021 | Kim et al. |
| 2021/0375981 A1 | 12/2021 | Kwon et al. |
| 2022/0102583 A1* | 3/2022 | Baumheinrich ........ G02B 6/105 |
| 2022/0130810 A1* | 4/2022 | Park ..................... H01L 25/167 |
| 2022/0139997 A1 | 5/2022 | Suga et al. |
| 2022/0275924 A1* | 9/2022 | van der Sijde ..... H01L 25/0753 |
| 2022/0293838 A1* | 9/2022 | Misaki ............... H10H 20/8314 |

FOREIGN PATENT DOCUMENTS

| | | |
|---|---|---|
| KR | 10-2021-0057299 A | 5/2021 |
| KR | 10-2021-0144485 A | 11/2021 |
| KR | 10-2021-0145553 A | 12/2021 |
| KR | 10-2021-0145590 A | 12/2021 |
| KR | 10-2021-0146166 A | 12/2021 |

* cited by examiner

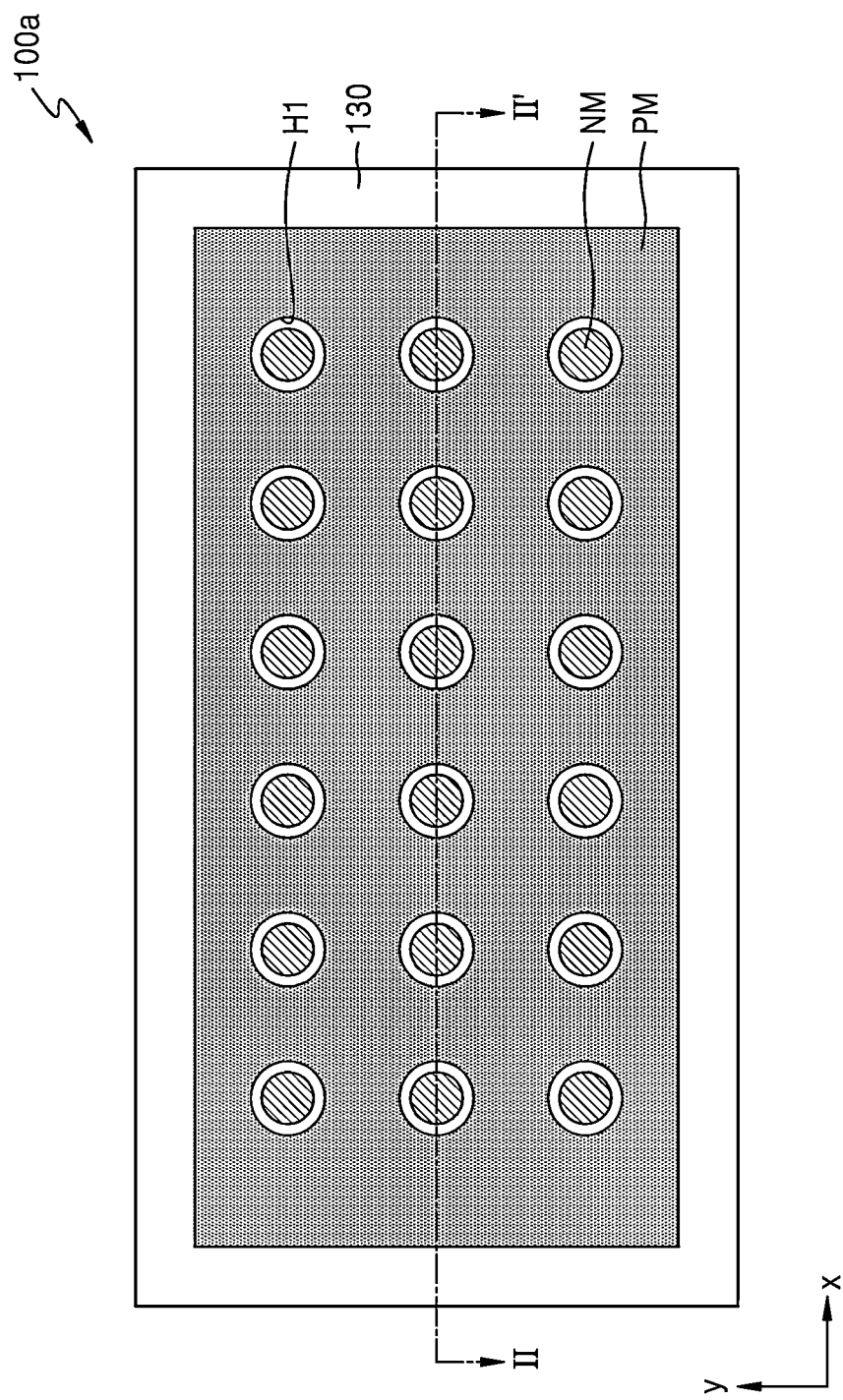

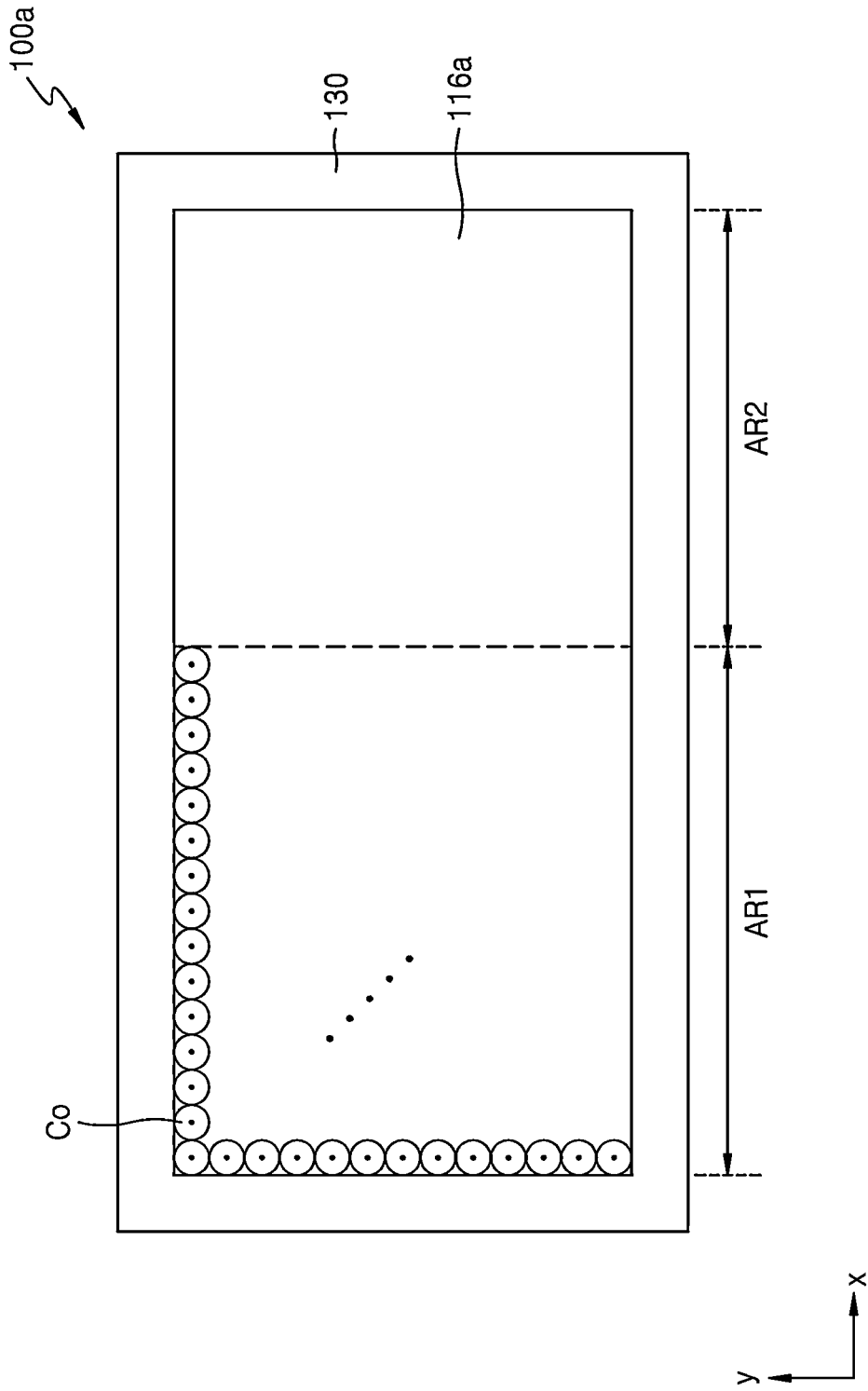

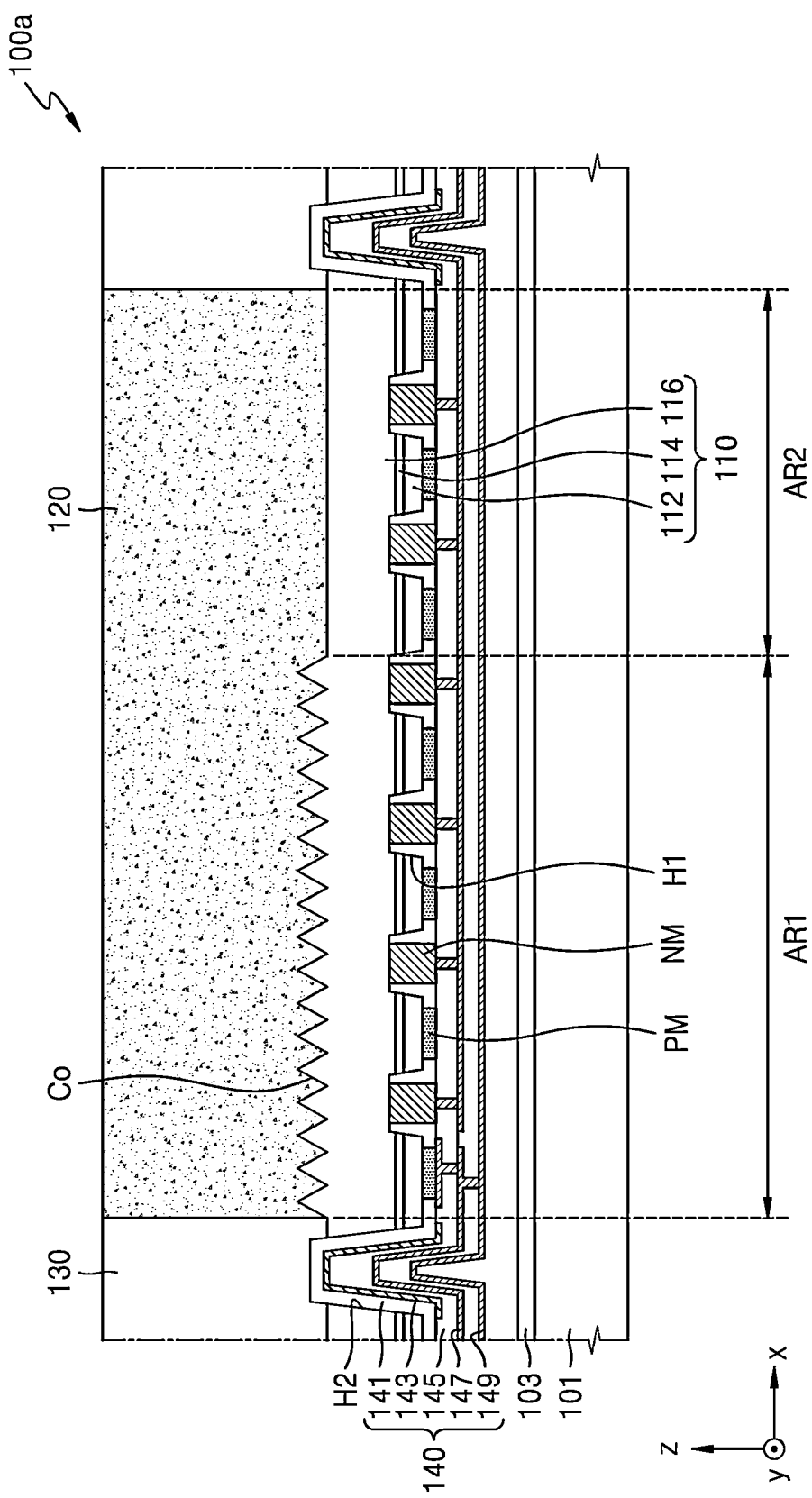

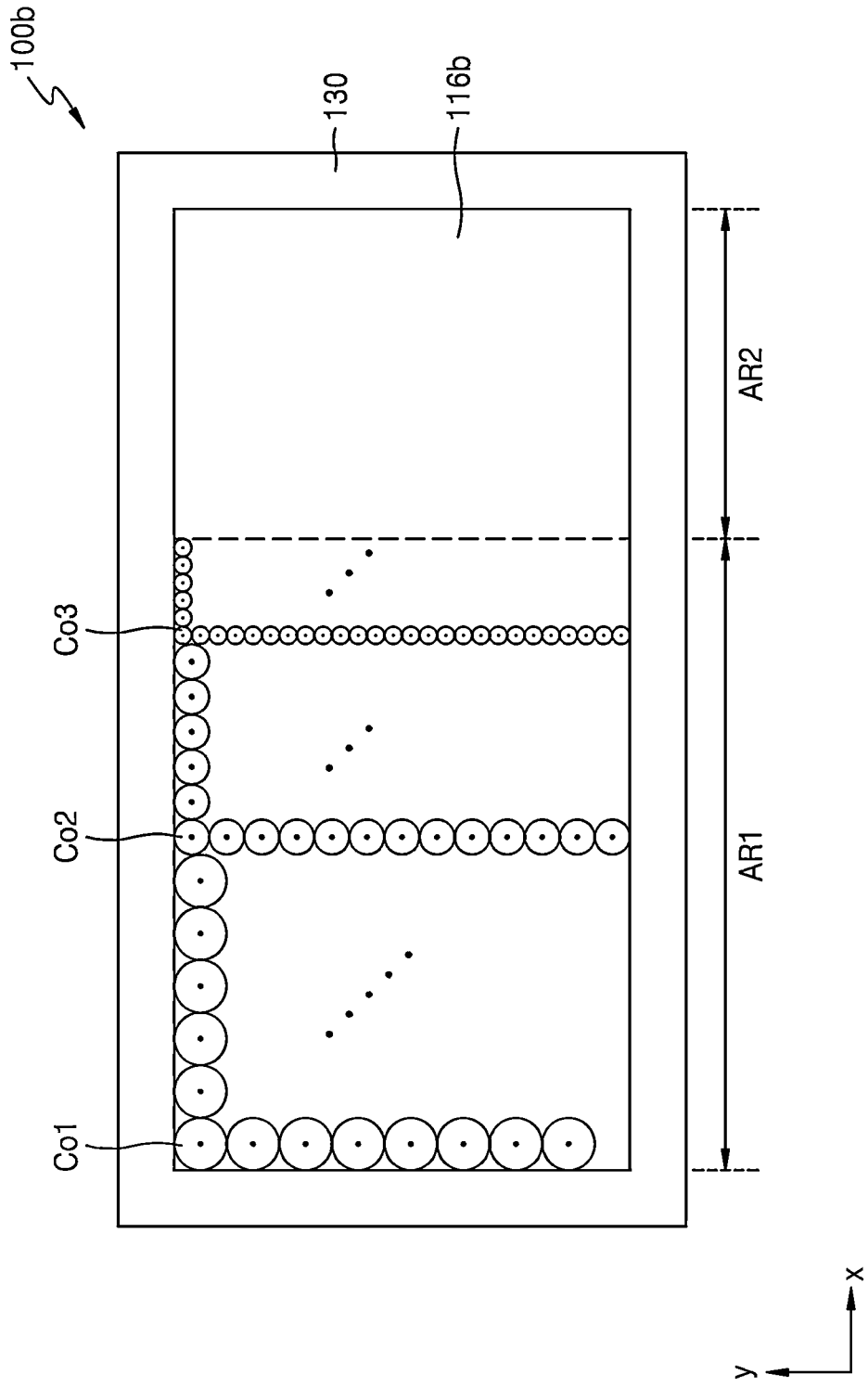

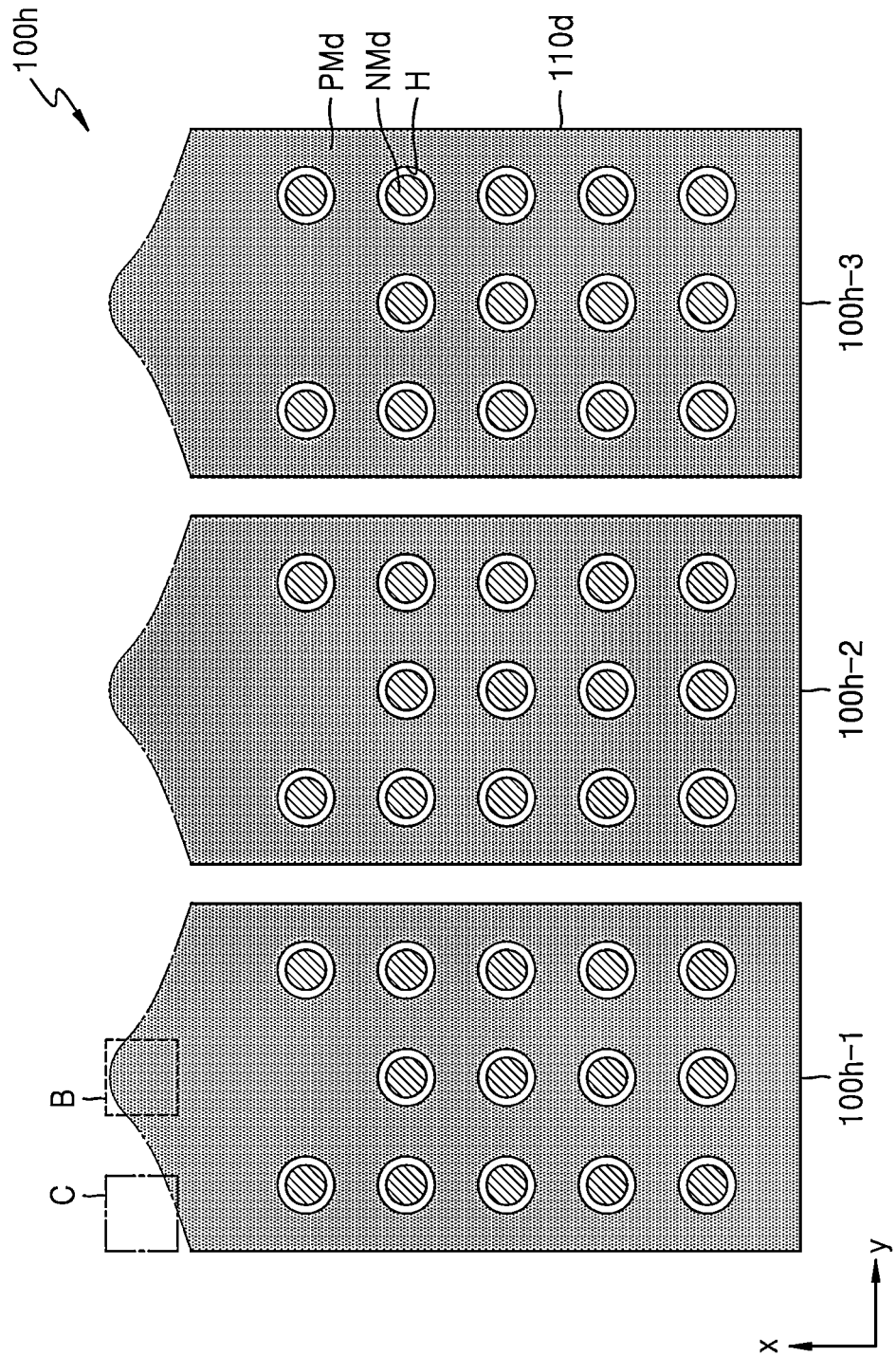

SEMICONDUCTOR LIGHT EMITTING DEVICE AND LIGHT EMITTING DEVICE ASSEMBLY INCLUDING THE SAME

CROSS-REFERENCE TO RELATED APPLICATION

This application claims priority to Korean Patent Application No. 10-2022-0017774, filed on Feb. 10, 2022 in the Korean Intellectual Property Office, the disclosure of which is incorporated by reference herein in its entirety.

BACKGROUND

Embodiments of the present disclosure relate to a light emitting device, and more particularly, to a semiconductor light emitting device and a light emitting device assembly including the semiconductor light emitting device.

A semiconductor light emitting device, such as a light emitting diode (LED), includes a material that converts energy generated by recombining electrons with holes of a bonded semiconductor into light and emits the light. LEDs are currently widely used as lighting devices, display devices, and light sources, and the development thereof has been accelerated. In particular, based on the recent commercialization of mobile phone keypads, turn signal lamps, and camera flashes using gallium nitride (GaN)-based LEDs, general lighting using LEDs has been actively developed. For example, small portable products such as backlight units of large televisions (TVs), automobile headlights, and general lighting have been developed as large, high-power, and high-efficiency products, and light sources having characteristics needed for such products are required.

SUMMARY

One or more embodiments provide a semiconductor light emitting device configured to more effectively implement gradation, and a light emitting device assembly including the semiconductor light emitting device.

In addition, the issues to be solved by the technical idea of the present disclosure are not limited to those mentioned above, and other issues may be clearly understood by those of ordinary skill in the art from the following descriptions.

According to an aspect of an embodiment, there is provided a semiconductor light emitting device including a base layer, a light emitting structure including a first semiconductor layer having a first conductivity, an active layer, and a second semiconductor layer having a second conductivity different from the first conductivity, the first semiconductor layer, the active layer, and the second semiconductor layer being sequentially disposed on the base layer, a wavelength converting layer on the light emitting structure, a separation wall disposed adjacent to side surfaces of the wavelength converting layer, a first electrode metal layer on a lower surface of the first semiconductor layer, the first electrode metal layer including a reflection structure, and a second electrode metal layer electrically connected to the second semiconductor layer via through holes penetrating the first electrode metal layer, the first semiconductor layer, and the active layer, and exposing the second semiconductor layer, wherein the semiconductor light emitting device is configured to implement gradation in a first direction based on adjusting at least one of the light emitting structure on an upper surface of the second semiconductor layer, the reflection structure, the separation wall, and a structure included in the light emitting structure.

According to another aspect of an embodiment, there is provided a semiconductor light emitting device including a base layer, a light emitting structure including a first semiconductor layer having a first conductivity, an active layer, and a second semiconductor layer having a second conductivity different from the first conductivity, the first semiconductor layer, the active layer, and the second semiconductor layer being sequentially disposed on the base layer, a wavelength converting layer on the light emitting structure, a separation wall disposed adjacent to side surfaces of the wavelength converting layer, a first electrode metal layer on a lower surface of the first semiconductor layer, and a second electrode metal layer electrically connected to the second semiconductor layer via through holes penetrating the first electrode metal layer, the first semiconductor layer, and the active layer, and exposing the second semiconductor layer, wherein the semiconductor light emitting device is configured to implement gradation in a first direction based on adjusting an amount of light emitted from the light emitting structure on an upper surface of the second semiconductor layer or adjusting the separation wall.

According to another aspect of an embodiment, there is provided a semiconductor light emitting device including a base layer, a light emitting structure including a first semiconductor layer having a first conductivity, an active layer, and a second semiconductor layer having a second conductivity different from the first conductivity, the first semiconductor layer, the active layer, and the second semiconductor layer being sequentially disposed on the base layer, a wavelength converting layer on the light emitting structure, a separation wall disposed adjacent to side surfaces of the wavelength converting layer, a first electrode metal layer on a lower surface of the first semiconductor layer, the first electrode metal layer including a reflection structure, and a second electrode metal layer electrically connected to the second semiconductor layer via through holes penetrating the first electrode metal layer, the first semiconductor layer, and the active layer, and exposing the second semiconductor layer, wherein the semiconductor light emitting device is configured to implement gradation in a first direction based on adjusting an amount of light emitted from the light emitting structure based on the reflection structure or a structure included in the light emitting structure.

According to another aspect of an embodiment, there is provided a light emitting device assembly including a mounting substrate, and a plurality of semiconductor light emitting devices disposed on the mounting substrate in a two-dimensional array, wherein the semiconductor light emitting devices includes gradation semiconductor light emitting devices and non-gradation semiconductor light emitting devices, and wherein each of the gradation semiconductor light emitting devices includes a base layer, a light emitting structure including a first semiconductor layer having a first conductivity, an active layer, and a second semiconductor layer having a second conductivity different from the first conductivity, the first semiconductor layer, the active layer, and the second semiconductor layer being sequentially disposed on the base layer, a wavelength converting layer on the light emitting structure, a separation wall disposed adjacent to side surfaces of the wavelength converting layer, a first electrode metal layer on a lower surface of the first semiconductor layer, the first electrode metal layer including a reflection structure, and a second electrode metal layer electrically connected to the second semiconductor layer via through holes penetrating the first electrode metal layer, the first semiconductor layer, and the active layer, and exposing the second semiconductor layer, and wherein each of the gradation semiconductor light emitting devices are configured to implement gradation in a first direction based on adjusting at least one of the light emitting structure on an upper surface of the second semiconductor layer, the reflection structure, the separation wall, and a structure included in the light emitting structure.

BRIEF DESCRIPTION OF THE DRAWINGS

The above and/or other aspects, features, and advantages of example embodiments of the disclosure will be more apparent from the following description taken in conjunction with the accompanying drawings, in which:

FIGS. 2A and 2B are plan views and FIG. 2C is a cross-sectional view of a semiconductor light emitting device, according to example embodiments;

FIGS. 3A and 3B are respectively a plan view and a cross-sectional view of a semiconductor light emitting device, according to example embodiments;

FIGS. 8A and 8C are plan views and FIG. 8B is a perspective view of a semiconductor light emitting device, according to example embodiments;

DETAILED DESCRIPTION OF THE EMBODIMENTS

Figure 1A:
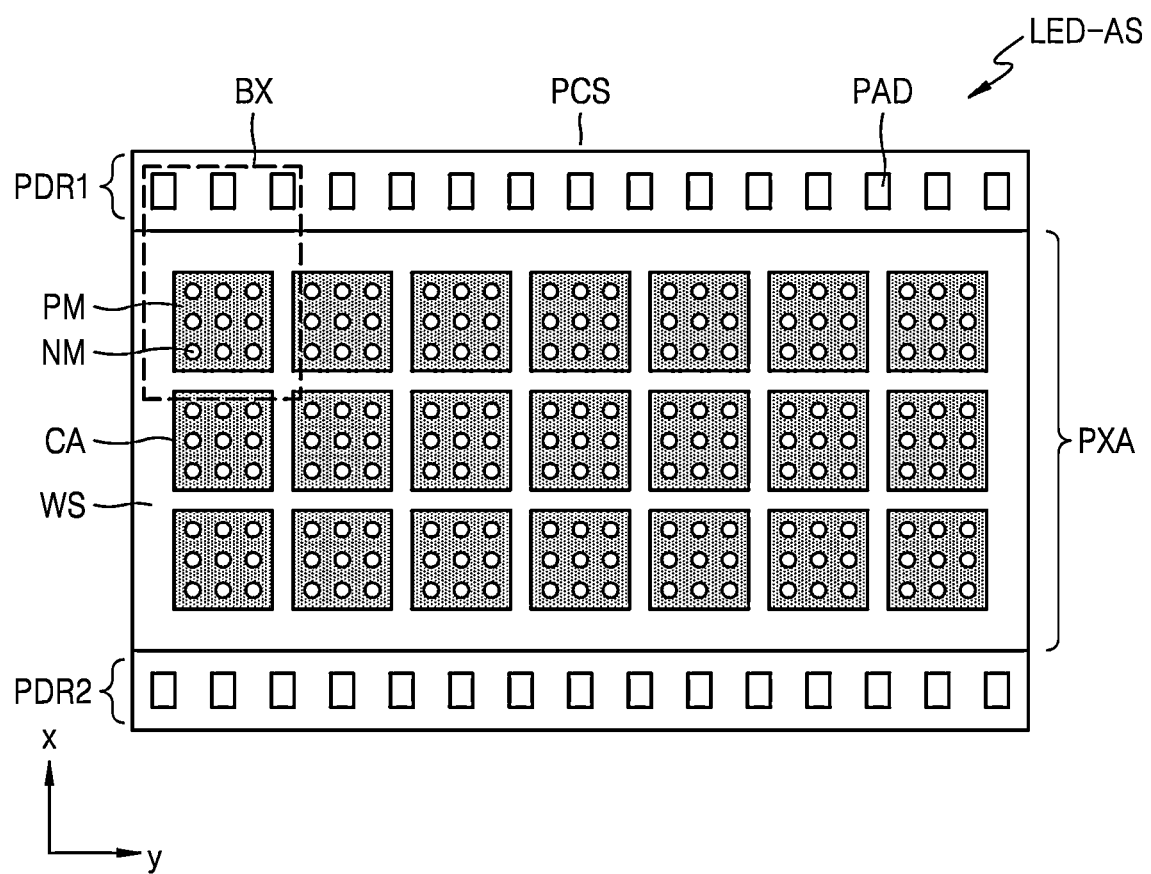
FIG. 1A is a schematic plan view of a light emitting device assembly including semiconductor light emitting devices, according to an example embodiment.

Hereinafter, embodiments will be described in detail with reference to the accompanying drawings. Identical reference numerals are used for the same constituent elements in the drawings, and duplicate descriptions thereof are omitted. Embodiments described herein are example embodiments, and thus, the disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1B:
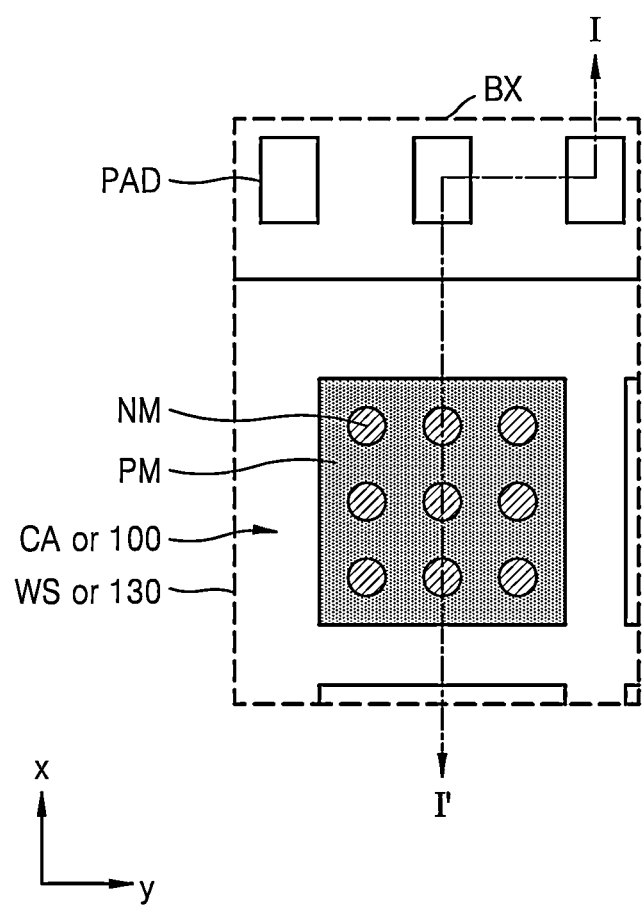
FIGS. 1B and 1C are respectively an enlarged view and a cross-sectional view of a light emitting device portion and a pad portion, in the light emitting device assembly including semiconductor light emitting devices of FIG. 1A.
Figure 1C:
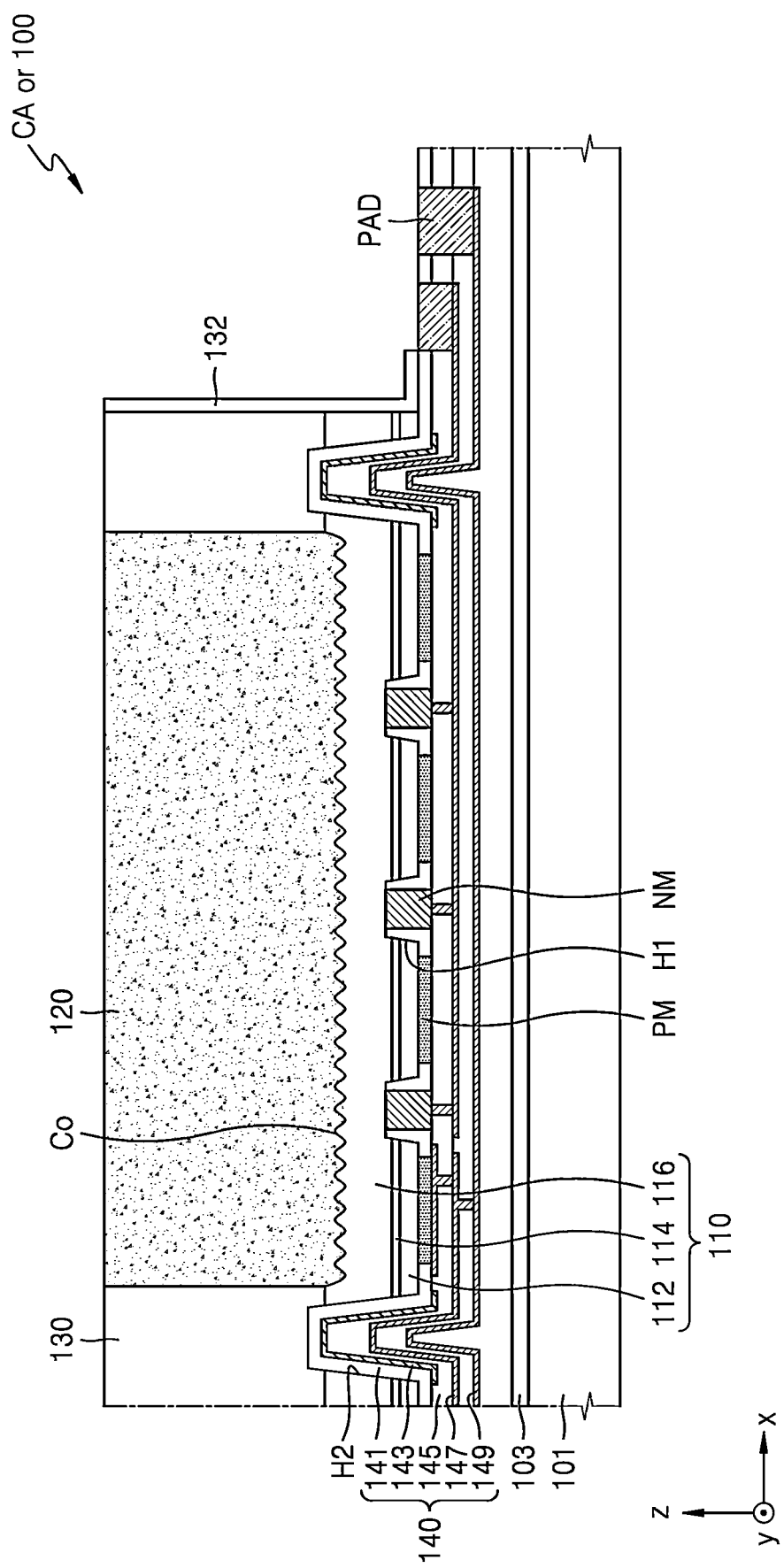

FIG. 1A is a schematic plan view of a light emitting device assembly including semiconductor light emitting devices, according to an example embodiment, FIG. 1B is an enlarged view of region BX of the semiconductor light emitting device in FIG. 1A, and FIG. 1C is a cross-sectional view of a portion cut along line I-I' in FIG. 1B.

Referring to FIG. 1A, a light emitting device assembly including the semiconductor light emitting device (hereinafter, referred to as a "light emitting device assembly LED-AS") according to an example embodiment may include semiconductor light emitting devices CA and pads PAD, which are mounted on a printed circuit board (PCB). Controllers configured to control the semiconductor light emitting devices CA may be arranged on the PCB.

Each of the semiconductor light emitting devices CA may be referred to as a light emitting cell, and may be manufactured in a chip form and mounted in a two-dimensional array structure on the PCB. However, according to an embodiment, all of the semiconductor light emitting devices CA may be manufactured in one chip form and may also be mounted on the PCB. In FIG. 1A, 21 semiconductor light emitting devices CA are arranged in a 7*3 array structure, but the number and an array structure of the semiconductor light emitting devices CA are not limited thereto. In addition, each of the semiconductor light emitting devices CA may correspond to a semiconductor light emitting device 100 of FIG. 1C.

As illustrated in FIG. 1A, the semiconductor light emitting devices CA may be arranged in a cell array area PXA. In addition, the semiconductor light emitting devices CA may be spaced apart from each other by a separation wall WS. The separation wall WS may have a wider width at periphery portions than between adjacent semiconductor light emitting devices CA. The pads PAD may be arranged in a first pad region PDR1 and a second pad region PDR2 on an upper portion and a lower portion of the cell array area PXA in a first direction (x-axis direction), respectively. However, embodiments are not limited thereto. For example, the pads PAD may be arranged on a left side and a right side of the cell array area PXA in a second direction (y-axis direction), or may also be arranged on all four sides of the periphery of the cell array area PXA. In the light emitting device assembly LED-AS, the semiconductor light emitting devices CA may be individually on/off by using a control of the controllers.

Referring to FIGS. 1B and 1C, the semiconductor light emitting device 100 may include a base layer 101, an electrode structure PM/NM/140, a light emitting structure 110, a wavelength converting layer 120, and a separation wall 130.

The base layer 101 may be arranged under lower surfaces of the electrode structure PM/NM/140 and the light emitting structure 110. The base layer 101 may include, for example, a sapphire substrate, a glass substrate, a transparent conductive substrate, a silicon substrate, a silicon carbide substrate, etc. However, a material of the base layer 101 is not limited to the above-described materials. An adhesive layer 103 may be arranged between the base layer 101, and the electrode structure PM/NM/140 and the light emitting structure 110. The adhesive layer 103 may include an electrical insulation material, for example, silicon oxide, silicon nitride, polymer material such as an ultraviolet (UV) thermosetting material, or resin. In some embodiments, the adhesive layer 103 may include a eutectic adhesive material such as gold-tin (AuSn) and nickel monosilicide (NiSi).

The electrode structure PM/NM/140 may include a first electrode metal layer PM, a second electrode metal layer NM, and a wiring layer 140. In this case, the first electrode metal layer PM may be connected to a first semiconductor layer 112. The second electrode metal layer NM may be connected to a second semiconductor layer 116. Wires of the wiring layer 140 may be electrically connected to the first electrode metal layer PM and the second electrode metal layer NM, and may connect the first electrode metal layer PM and the second electrode metal layer NM to the pad.

The light emitting structure 110 may include the first semiconductor layer 112 and the second semiconductor layer 116, which have different conductive types from each other, and an active layer 114 therebetween. For example, the first semiconductor layer 112 may include a semiconductor layer doped with p-type impurities, and the second semiconductor layer 116 may include a semiconductor layer doped with n-type impurities. A light emitting structure Co, for example, a plurality of irregularities may be formed on an upper surface of the second semiconductor layer 116. A light extraction efficiency from the light emitting structure 110 may be improved by the light emitting structure Co. The wavelength converting layer 120 may be arranged on the light emitting structure 110, and may change a wavelength of light emitted by the light emitting structure 110.

The separation wall 130 may be arranged in a shape of surrounding side surfaces of the wavelength converting layer 120 and provided adjacent to the converting layer 120, and may have a structure to improve a light reflection efficiency and a light extraction efficiency. For example, the separation wall 130 may be arranged on the side surfaces of the wavelength converting layer 120, and may prevent light generated by the light emitting structure 110 from being emitted in a lateral direction. The separation wall 130 may emit light generated by the light emitting structure 110 in an upward direction. According to an embodiment, the separation wall 130 may surround the entire side surface or a portion of the side surfaces of the light emitting structure 110. The separation wall 130 may include, for example, silicon (Si), silicon carbide (SiC), sapphire, or gallium nitride (GaN). A passivation layer 132 may be arranged on the sidewalls of the separation wall 130.

For reference, the separation wall 130 may be formed based on a silicon substrate. For example, the light emitting structure 110 may be formed by growing on a silicon substrate. Thereafter, the central portion of a silicon substrate may be removed to expose an upper surface of the light emitting structure 110, the removed portion of the silicon substrate may be filled with a wavelength transforming material, and then, the wavelength converting layer 120 may be formed. In addition, a portion of the silicon substrate, that remains unremoved, may constitute the separation wall 130. To improve a light reflection efficiency and a light extraction efficiency, a highly reflective coating layer may be formed on inner surfaces of the separation wall 130.

In the semiconductor light emitting device 100 according to the embodiment, electron-hole recombination may occur in the active layer 114 by a power applied via the electrode structure PM/NM/140, and light may be generated by the electron-hole recombination. For example, via a power applied to the first electrode metal layer PM and the second electrode metal layer NM, light may be generated by the light emitting structure 110 positioned therebetween. Light generated by the light emitting structure 110 may be emitted outside in the upper direction via the wavelength converting layer 120.

In the semiconductor light emitting device 100 according to the embodiment, the light emitting structure 110 may include the first semiconductor layer 112, the active layer 114, and the second semiconductor layer 116, which are sequentially stacked. As described above, the light emitting structure 110 may grow on a silicon substrate. According to an embodiment, a sapphire substrate may be used as a growth substrate instead of a silicon substrate.

The first semiconductor layer 112 may include a semiconductor layer doped with p-type impurities. For example, the first semiconductor layer 112 may include a p-type nitride semiconductor layer. The second semiconductor layer 116 may include a semiconductor layer doped with n-type impurities. For example, the second semiconductor layer 116 may include an n-type nitride semiconductor layer. The first and second semiconductor layers 112 and 116 may have a composition formula of $Al_xIn_yGa_{(1-x-y)}N$ (wherein, $0 \leq x \leq 1$, $0 \leq y \leq 1$, and $0 \leq x+y \leq 1$). For example, the first and second semiconductor layers 112 and 116 may include a material such as GaN, aluminum gallium nitride (AlGaN), indium gallium nitride (InGaN), and aluminum indium gallium nitride (AlInGaN). In this case, the n-type impurity may include Si, and the p-type impurity may include magnesium (Mg).

The active layer 114 arranged between the first and second semiconductor layers 112 and 116 may emit light having a certain energy by recombination of electrons and holes. The active layer 114 may include a material having an energy band gap less than an energy band gap between the first and second semiconductor layers 112 and 116. For example, when the first and second semiconductor layers 112 and 116 include GaN-based compound semiconductors, the active layer 114 may include an InGaN-based compound semiconductor having an energy band gap less than that of GaN. The active layer 114 may have a multiple quantum wells (MQW) structure, in which a quantum well layer and a quantum barrier layer are alternately stacked on each other. For example, the active layer 114 may have an InGaN/GaN structure. However, the structure of the active layer 114 is not limited thereto. For example, in other embodiments, the active layer 114 may have a single quantum well (SQW) structure.

The light emitting structure 110 may include a plurality of first through holes H1, which penetrate the first semiconductor layer 112 and the active layer 114, and expose a lower surface of the second semiconductor layer 116. The inner surfaces of the first through holes H1 may have an inclined shape. In addition, as illustrated in FIG. 1C, the first through holes H1 may expand into the second semiconductor layer 116, while forming grooves in the lower surface of the second semiconductor layer 116.

The first through holes H1 may be used as connection paths, through which the second electrode metal layer NM, to be described later, is connected to the second semiconductor layer 116. The first through holes H1 may, as illustrated in FIGS. 1A and 1B, be arranged on the light emitting structure 110 in a two-dimensional array structure, in a plan view. For example, the first through holes H1 may form a plurality of rows and columns in the first direction (x-axis direction) and the second direction (y-axis direction). In this case, intervals between the first through holes H1 adjacent to each other in the first direction (x-axis direction) or the second direction (y-axis direction) may be the same as each other. In addition, in a plan view, sums of areas of the first through holes H1 per unit area on the light emitting structure 110 may be substantially the same as each other. However, according to an embodiment, intervals between the first through holes H1 adjacent to each other in the first direction (x-axis direction) or the second direction (y-axis direction) may also be different from each other. In addition, according to an embodiment, in a plan view, the sum of areas of the first through holes H1 per unit area on the light emitting structure 110 may also vary in the first direction (x-axis direction) or the second direction (y-axis direction). For example, the intervals between the first through holes H1 and the sums of areas of the first through holes H1 per unit area may be appropriately adjusted for gradation.

A structure of each of the first through holes H1 may have a cross-section of a circular shape. However, the shape of the horizontal cross-section of the first through holes H1 is not limited to a circle. For example, the horizontal cross-section of the first through holes H1 may have an elliptical shape or a polygonal shape. As illustrated in FIG. 1C, each of the first through holes H1 may have a width gradually decreasing toward the top in the first direction (x-axis direction).

The first electrode metal layer PM may be arranged on the first semiconductor layer 112 of the light emitting structure 110. For example, the first electrode metal layer PM may be connected to a lower surface of the first semiconductor layer 112. The first electrode metal layer PM may be electrically connected to the first semiconductor layer 112. As shown in FIG. 1B, the first electrode metal layer PM may be arranged over the entire lower surface of the light emitting structure 110. In addition, as shown in FIG. 1C, the first electrode metal layer PM may not extend to inner sides of the first through holes H1.

The first electrode metal layer PM may include a highly reflective metal material. For example, the first electrode metal layer PM may include silver (Ag) or aluminum (Al). In the semiconductor light emitting device 100 according to the embodiment, the first electrode metal layer PM may include Ag.

A first insulating layer 141 may be arranged on the inner side surfaces of the first through holes H1. For example, the first insulating layer 141 may cover the inner side surfaces of the first through holes H1. In addition, the first insulating layer 141 may cover side surfaces of the first semiconductor layer 112, side surfaces of the active layer 114, side surfaces of the second semiconductor layer 116 and a portion of the lower surface of the first semiconductor layer 112. Furthermore, the first insulating layer 141 may cover inner side surfaces and an upper surface of second through holes H2 formed under the separation wall 130. The first insulating layer 141 may include an insulating material. For example, the first insulating layer 141 may include an insulating material, such as silicon oxide ($SiO_2$), titanium oxide ($TiO_2$), or niobium oxide ($Nb_2O_5$).

The second electrode metal layer NM may be arranged on the light emitting structure 110. The second electrode metal layer NM may be arranged on the light emitting structure 110 in a structure extending into the first through hole H1. In addition, the second electrode metal layer NM may be connected to the second semiconductor layer 116 at an upper surface portion of the first through hole H1. Accordingly, the second electrode metal layer NM may be electrically connected to the second semiconductor layer 116.

The second electrode metal layer NM may include a metal material such as Al, chromium (Cr), titanium (Ti), copper (Cu), and Au, or an alloy thereof. According to an embodiment, the second electrode metal layer NM may include a highly reflective metal material. For example, the second electrode metal layer NM may include Ag or Al. In the semiconductor light emitting device 100 according to the embodiment, the second electrode metal layer NM may include Ag.

The wiring layer 140 may be arranged on the lower surfaces of the light emitting structure 110, the first electrode metal layer PM, and the second electrode metal layer NM. The wiring layer 140 may include the first insulating layer 141, a lower reflective layer 143, an interlayer insulating layer 145, and wirings 147 and 149. The first insulating layer 141 may cover the inner side surfaces of the first through holes H1 and the second through holes H2. In this case, the second through holes H2 may be formed in a structure penetrating the light emitting structure 110, and may be formed in a portion corresponding to the separation wall 130 and overlap the separation wall 130 in the first direction (x-axis direction). For example, the second through holes H2 and the material layers therein may constitute a device separation region. Accordingly, as shown in FIG. 1B, the second through holes H2 may have a shape surrounding and provided adjacent to the light emitting structure 110 in a plan view, and may separate the adjacent light emitting devices 100 from each other.

The interlayer insulating layer 145 may cover the light emitting structure 110 and the first insulating layer 141. For example, the interlayer insulating layer 145 may cover lower surfaces of the first electrode metal layer PM and the first insulating layer 141, and in addition, may extend into the second through holes H2 to cover the lower surface of the first insulating layer 141. The interlayer insulating layer 145 may include an insulating material. For example, the interlayer insulating layer 145 may include an insulating material, such as silicon oxide ($SiO_2$), titanium oxide ($TiO_2$), and niobium oxide ($Nb_2O_5$). The interlayer insulating layer 145 may include a plurality of insulating layers, and the lower reflective layer 143 and the wirings 147 and 149 may be arranged on corresponding insulating layers.

The lower reflective layer 143 may be formed only on the first insulating layer 141 in the second through holes H2. The lower reflective layer 143 may redirect the light emitted through the sidewalls of the plurality of light emitting structures 110 toward the wavelength converting layer 120. The lower reflective layer 143 may include a metal material having high reflectivity. The lower reflective layer 143 may include, for example, Ag, Al, Ni, Cr, Au, platinum (Pt), palladium (Pd), tin (Sn), tungsten (W), rhodium (Rh), iridium (Ir), ruthenium (Ru), Mg, zinc (Zn), Ti, Cu, or a combination thereof. In other embodiments, the lower reflective layer 143 may have a distributed Bragg reflector (DBR) structure. The DBR structure is described in more detail with reference to FIGS. 4A and 4B.

The wirings 147 and 149 may include a first wiring 147 and a second wiring 149, and may be arranged on corresponding insulating layers of the interlayer insulating layer 145. As illustrated in FIG. 1C, the first wiring 147 may connect the second electrode metal layer NM to the pad corresponding to the second electrode metal layer NM, and the second wiring layer 149 may connect the first electrode metal layer PN to the pad corresponding to the first electrode metal layer PN. Some of the first wiring 147 may not be connected to the second electrode metal layer NM, and may function as a medium wiring for connecting the first electrode metal layer PN to the second wiring layer 149. Each of the wirings 147 and 149 may include Ag, Al, Ni, Cr, Au, Pt, Pd, Sn, W, Rh, Ir, Ru, Mg, Zn, Ti, Cu, or a combination thereof. In addition, portions of the first insulating layer 141, the lower reflective layer 143, the interlayer insulating layer 145, and the wirings 147 and 149 may fill the second through hole H2, to constitute the device separation region.

The pads PAD connected to the wirings 147 and 149 may be arranged on the first pad region PDR1 and the second pad region PDR2 (in FIG. 1A). The pad may be arranged at a lower vertical level than the separation wall 130. For example, sidewalls and a bottom surface of the pad may be covered by the interlayer insulating layer 145, and an upper surface of the pad may be positioned at a lower level than the upper surface of the plurality of light emitting structures 110. In other embodiments, unlike as illustrated in FIG. 1C, a portion of the light emitting structure 110 may be arranged in the first and second pad regions PDR1 and PDR2, and the pad may be arranged in an opening formed in the light emitting structure 110. In the case of such a structure, the upper surface of the pad may be positioned substantially at the same level as the upper surface of the light emitting structure 110. A connection member, such as a bonding wire for electrical connection to a controller, may be arranged on the pad.

The wavelength converting layer 120 may be provided on the light emitting structure 110. The wavelength converting layer 120 may convert light emitted by the light emitting structure 110 into light of desired wavelengths. The wavelength converting layer 120 may include wavelength converting materials. The wavelength converting material may convert a wavelength of light generated by the light emitting structure 110. For example, the wavelength converting material may include a quantum dot phosphor, and the quantum dot phosphor may have nano-sized particles. The quantum dot phosphor may have a core-shell structure by using a III-V or II-VI compound semiconductor. For example, the core may include cadmium selenide (CdSe) and/or indium phosphide (InP), or the like, and the shell may include zinc sulfide (ZnS) and/or zinc selenide (ZnSe). In addition, the quantum dot phosphor may further include a ligand for stabilizing the core and the shell. In addition, in other embodiments, additional wavelength converting particles may be provided over the wavelength converting layer 120.

The semiconductor light emitting device 100 according to the embodiment may have a structure, in which an amount of light emitted by the light emitting structure 110 is controlled, and based on the structure, gradation may be effectively implemented in one direction. For example, the semiconductor light emitting device 100 according to the embodiment may include a cone-shaped light emitting structure on the upper surface of the second semiconductor layer 116, and may implement gradation in one direction by varying a size or density of the cone. In addition, by changing the structure of the separation wall 130 on both sides in one direction, the semiconductor light emitting device 100 of the embodiment may implement gradation in one direction. Furthermore, the semiconductor light emitting device 100 according to the embodiment may implement gradation in one direction, while the first electrode metal layer PM includes metal materials having different reflectivity per region in one direction. By changing a length of the light emitting structure 110 in one direction, the semiconductor light emitting device 100 of the embodiment may implement gradation in one direction. In addition, the semiconductor light emitting device 100 according to the embodiment may further maximize the effect of gradation in one direction, by adjusting the sizes or density of the first through holes H1 in the light emitting structure 110 and the size or density of the second electrode metal layer NM corresponding thereto.

In a structure in which only the sizes and/or density of the first through holes H1, and the corresponding second electrode metal layer NM are adjusted, as a size of a semiconductor light emitting device is reduced or a wiring structure of a wiring layer is complex, there may be an issue of design limitations. In addition, the design of excessively biased electrode metal layers (NM/PM) may cause current concentration in an active region, and accelerate degradation of the current concentrated region, and thus, may cause poor reliability in the long run.

However, in the case of the semiconductor light emitting device 100 of the embodiment, because gradation is implemented by using only the above-described structure, in which the amount of light is adjusted, the above-described issue of design limitations may be solved. In addition, although positions and sizes of the electrode metal layers (NM/PM) are not significantly changed, effective gradation may be realized by controlling an amount of light emitted. Furthermore, the semiconductor light emitting device 100 of the embodiment may obtain a more natural gradation effect by controlling in detail extraction efficiency for each region, a light emitting area, etc.

For reference, FIGS. 1A through 1C illustrate basic structures of the semiconductor light emitting devices 100a through 100g of the embodiments, and a characteristic structure of each of the semiconductor light emitting devices 100a through 100g of the embodiments are described in detail below with reference to FIGS. 2A through 8C.

FIGS. 2A and 2B are plan views and FIG. 2C is a cross-sectional view of a semiconductor light emitting device 100a, according to example embodiments. FIG. 2A is a plan view viewed from the lower surface of the first electrode metal layer PM, FIG. 2B is a plan view viewed from the upper surface of the second semiconductor layer 116a, and FIG. 2C is a cross-sectional view of a portion cut along line II-II' in FIG. 2A. The contents already described with reference to FIGS. 1A through 1C are briefly described or omitted.

Referring to FIGS. 2A through 2C, the semiconductor light emitting device 100a of the embodiment may include the light emitting structure Co on an upper surface of a second semiconductor layer 116a of the semiconductor light emitting device 100a. The light emitting structure Co may include, for example, a plurality of cones. However, the light emitting structure Co is not limited to the plurality of cones. For example, the light emitting structure Co may also include a plurality of elliptical horns or polygonal horns. When the light emitting structure Co having a cone shape is formed on the upper surface of the second semiconductor layer 116a as described above, because light is emitted through side surface of the cone, an area, through which light is emitted, may be expanded. Accordingly, an amount of light emitted may increase, compared to an area, on which the light emitting structure Co is not included.

In the semiconductor light emitting device 100a according to the embodiment, the light emitting structure Co may be formed only on the upper surface of the second semiconductor layer 116a of a first region AR1 in the first direction (x-axis direction), and may not be formed on the upper surface of the second semiconductor layer 116a of a second region AR2. When the light emitting structure Co is formed in only one region in the first direction (x-axis direction), gradation may be implemented in the first direction (x-axis direction) in the semiconductor light emitting device 100a of the present embodiment. In other words, because due to the light emitting structure Co, an amount of light emitted by the first region AR1 increases, and accordingly, intensity of the light emitted by the first region AR1 increases compared to the second region AR2, gradation may be implemented, in which the first region AR1 is relatively brighter and the second region AR2 is relatively darker.

In the first region AR1, the central portion, on which the light emitting structure Co is concentrated, may be brightest, and the second region AR2 may become darker away from the first region AR1. Accordingly, gradation may be implemented, in which brightness gradually changes in the first direction (x-axis direction). In addition, by gradually decreasing the density of the light emitting structure Co in the first direction (x-axis direction), gradation may be maximized in the first direction (x-axis direction). In this case, the density may be defined as the number of light emitting structures Co per unit area. Gradation may be maximized in the first direction (x-axis direction), by forming a maximum number of light emitting structures Co per unit area on one side in the first direction (x-axis direction), and reducing the number of light emitting structures Co per unit area on the other side in the first direction (x-axis direction).

Figure 3B:
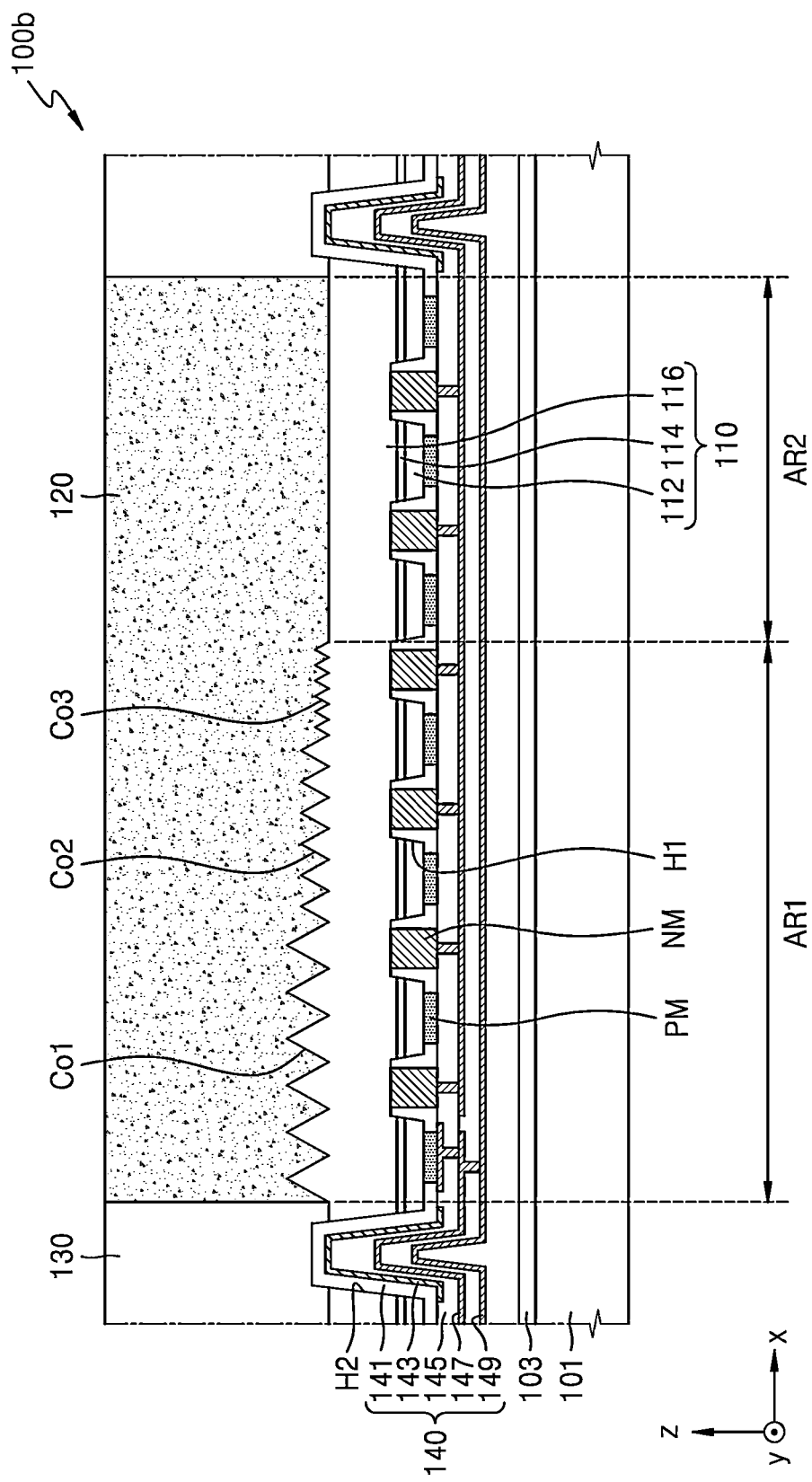

FIGS. 3A and 3B are respectively a plan view and a cross-sectional view of a semiconductor light emitting device 100b, according to example embodiments. FIG. 3A is a plan view viewed from the upper surface of the second semiconductor layer 116b, and FIG. 3B is a cross-sectional view corresponding to FIG. 2C. The contents already described with reference to FIGS. 1A through 2C are briefly described or omitted.

Referring to FIGS. 3A through 3B, the semiconductor light emitting device 100b of the embodiment may include first light emitting structures Co1, second light emitting structures Co2, and third light emitting structures Co3 on an upper surface of a second semiconductor layer 116b. Each of the first through third light emitting structures Co1 through Co3 may include, for example, a plurality of cones. However, each of the first through third light emitting structures Co1 through Co3 is not limited to the plurality of cones. For example, each of the first through third light emitting structures Co1 through Co3 may also include a plurality of elliptical horns or polygonal horns. When the first through third light emitting structures Co1 through Co3 having a cone shape is formed on the upper surface of the second semiconductor layer 116b as described above, because light is emitted through side surface of the cone, an area, through which light is emitted, may be expanded. Accordingly, an amount of light emitted may increase, compared to an area, on which the first through third light emitting structures Co1 through Co3 are not included.

In the semiconductor light emitting device 100b according to the embodiment, the first through third light emitting structures Co1 through Co3 may be formed only on the upper surface of the second semiconductor layer 116b of the first region AR1 in the first direction (x-axis direction), and may not be formed on the upper surface of the second semiconductor layer 116b of the second region AR2. Because the first through third light emitting structures Co1 through Co3 are formed in only one region in the first direction (x-axis direction) as described above, gradation may be implemented in the first direction (x-axis direction) in the semiconductor light emitting device 100b of the embodiment. For example, because due to the first through third light emitting structures Co1 through Co3, an amount of light emitted by the first region AR1 increases, and accordingly, intensity of the light emitted by the first region AR1 increases compared to the second region AR2, grada-tion may be implemented, in which the first region AR1 is relatively brighter and the second region AR2 is relatively darker.

In addition, in the semiconductor light emitting device 100b of the embodiment, the first through third light emitting structures Co1 through Co3 may include the first light emitting structure Co1, the second light emitting structure Co2, and the third light emitting structure Co3. As shown in FIG. 3B, the size of the cone may be reduced in an order of the first light emitting structure Co1, the second light emitting structure Co2, and the third light emitting structure Co3. In general, in the case of a light emitting structure of a cone shape, as the size increases, the light emission efficiency may increase. Accordingly, an amount of light emitted may increase in an order of the third light emitting structure Co3, the second light emitting structure Co2, and the first light emitting structure Co1. As a result, in the first direction (x-axis direction), in the first region AR1, the left portion, where the first light emitting structure Co1 is arranged, may be brightest, and then a portion of the second light emitting structure Co2 and a portion of the third light emitting structure Co3 may be brighter in this order. In addition, the second region AR2 may become darker away from the first region AR1, and thus, the right portion of the second region AR2 may be darkest. Accordingly, in the semiconductor light emitting device 100b of the embodiment, gradation may be more effectively implemented, based on the first through third light emitting structures Co1 through Co3 having different sizes from each other, in the first direction (x-axis direction).

Figure 4A:
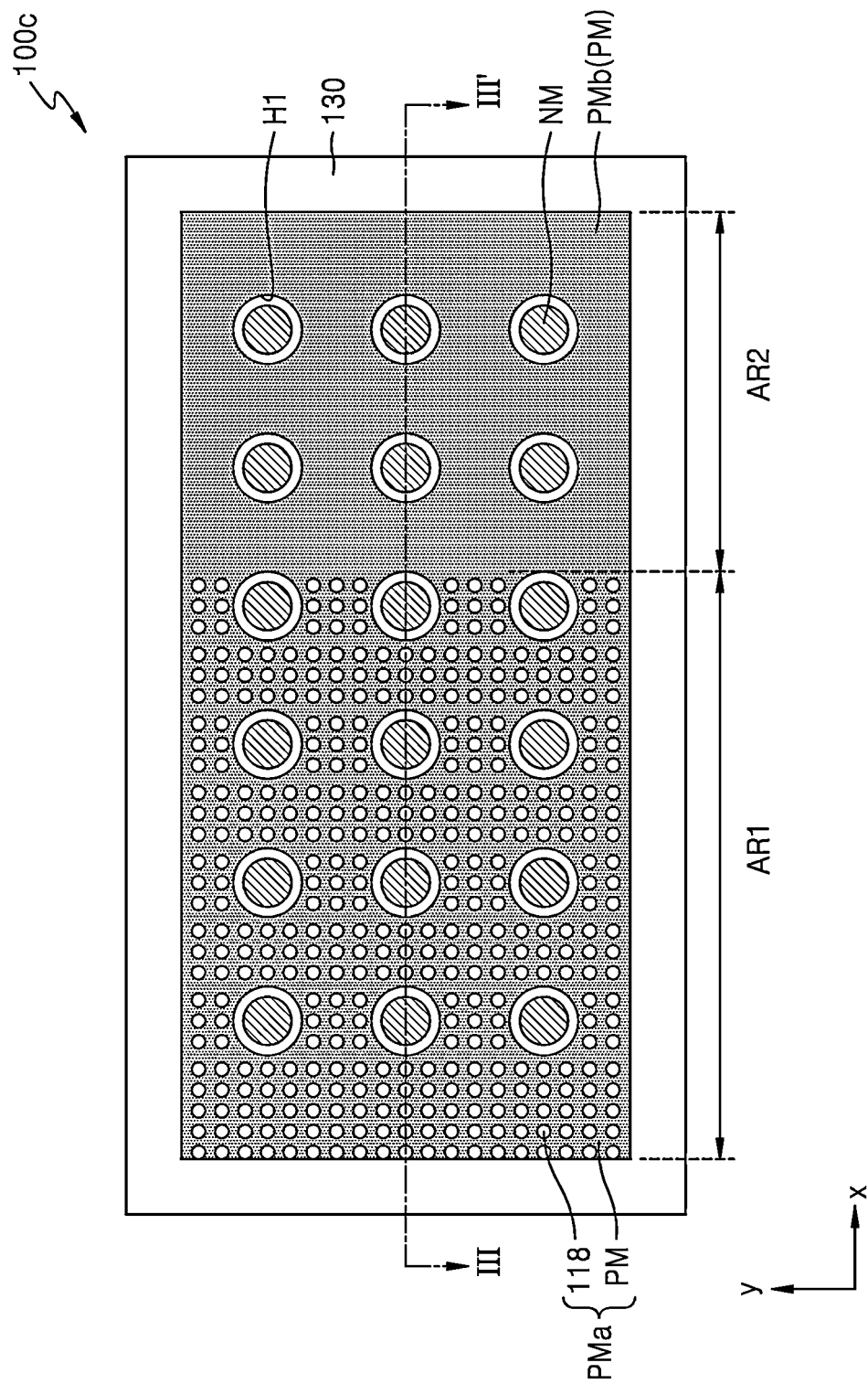
FIGS. 4A and 4B are respectively a plan view and a cross-sectional view of a semiconductor light emitting device, according to example embodiments.
Figure 4B:
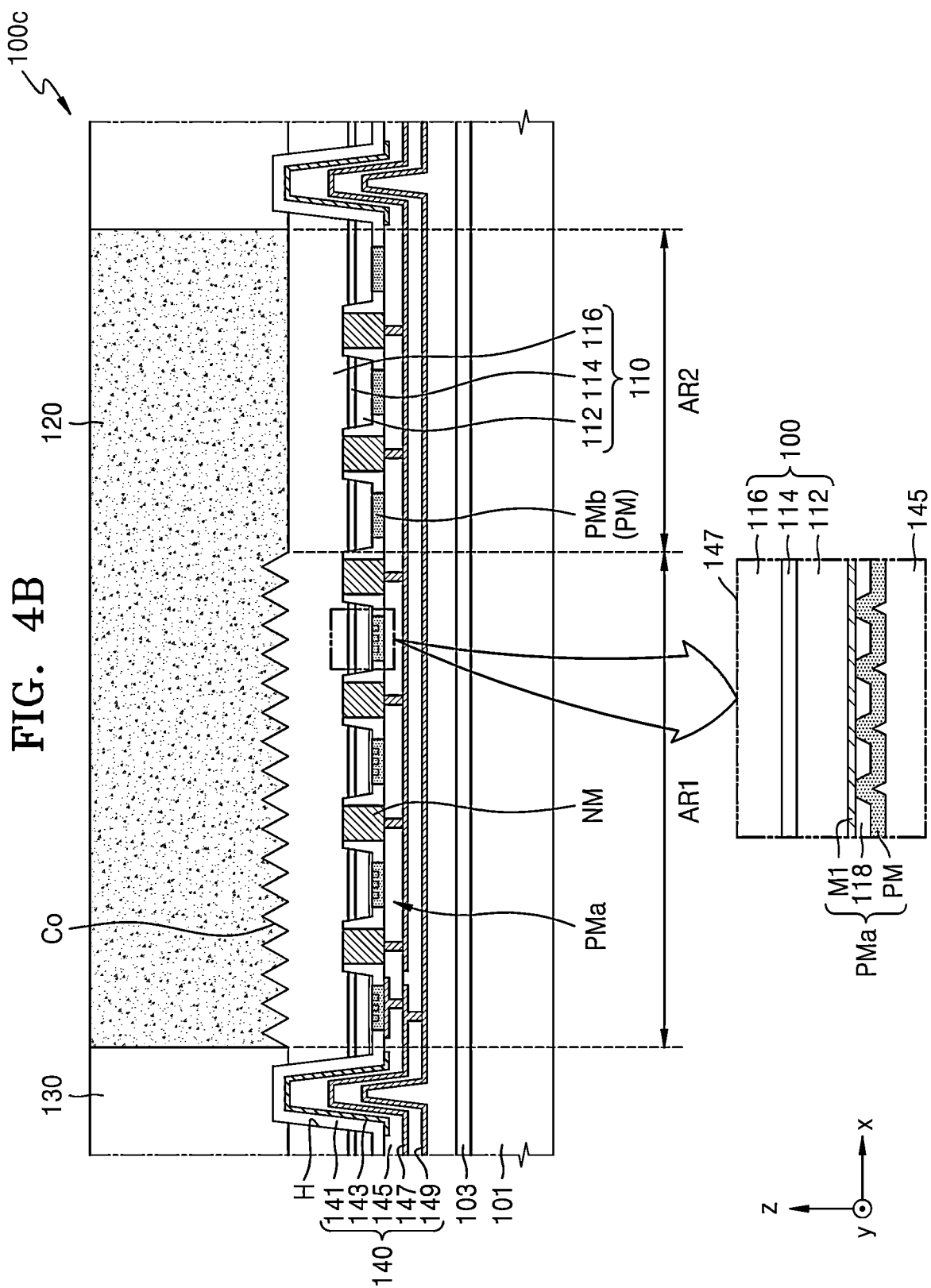

FIGS. 4A and 4B are respectively a plan view and a cross-sectional view of a semiconductor light emitting device 100c, according to example embodiments. FIG. 4A is a plan view viewed from the lower surface of the first electrode metal layers PMa and PMb, and FIG. 4B is a cross-sectional view of a portion cut along line III-III' in FIG. 4A. The contents already described with reference to FIGS. 1A through 1C are briefly described or omitted.

Referring to FIGS. 4A and 4B, in the semiconductor light emitting device 100c according to the embodiment, a first electrode metal layer PMa of the first region AR1 and a first electrode metal layer PMb of the second region AR2 may have different structures from each other. In the first region AR1, the first electrode metal layer PMa may have a multilayer structure including an intermediate conductive layer M1, an insulating layer 118, and an electrode metal layer PM. For example, the intermediate conductive layer M1 may be connected to the first semiconductor layer 112, and the insulating layer 118 may be arranged on the intermediate conductive layer M1. In addition, the electrode metal layer PM may cover the insulating layer 118, and may be connected to the intermediate conductive layer M1. However, embodiments are not limited thereto, and the first electrode metal layer PMb of the second region AR2 may have a single-layer structure of the electrode metal layer PM. The electrode metal layer PM of the first region AR1 and the second region AR2 may include a metal material substantially the same as the first electrode metal layer PM of the semiconductor light emitting device 100 of FIG. 1C. However, embodiments are not limited thereto, and the electrode metal layer PM may include other metal materials. In addition, the intermediate conductive layer M1 may include a transparent conductive layer, such as an indium tin oxide (ITO) material, or a very thin metal layer of about 20 Å or less. The intermediate conductive layer M1 may spread current from the first electrode metal layer PM to the first semiconductor layer 112.

In the structure of the first electrode metal layer PMa of the first region AR1, the insulating layer 118 may include an insulating material having a refractive index less than a refractive index of the first semiconductor layer 112. The insulating layer 118 may include an insulating material, such as $SiO_2$, $TiO_2$, and $Nb_2O_5$. In addition, the insulating layer 118 may have a structure, in which a plurality of layers having different refractive indices are alternately and repeatedly stacked. For example, any one of the plurality of layers may include $SiO_2$, and the other thereof may include $TiO_2$ or $Nb_2O_5$. Accordingly, the insulating layer 118 may have an omni-directional reflector (ODR) structure, or a distributed Bragg reflector (DBR) structure. Due to the ODR or DBR structure of the insulating layer 118, the first electrode metal layer PMa of the first region AR1 may have a multilayer structure.

When the insulating layer 118 has the ODR or DBR structure, reflectivity of the first electrode metal layer PMa may be maximized. Accordingly, light emission of the first region AR1, on which the first electrode metal layer PMa is arranged, may be maximized. As a result, in the semiconductor light emitting device 100c of the embodiment, the amount of light emitted from the first region AR1 due to the first electrode metal layer PMa may be increased, and accordingly, the intensity of light emitted from the first region AR1 may be higher than that from the second region AR2, and thus, the first region AR1 may be relatively brighter and the second region AR2 may be relatively darker.

In the first region AR1, the central portion, where the insulating layers 118 having the ODR or DBR structure are concentrated, may be brightest, and the second region AR2 may become darker away from the first region AR1. Accordingly, gradation may be implemented, in which brightness gradually changes in the first direction (x-axis direction). In addition, by gradually decreasing the density of the insulating layer 118 in the first direction (x-axis direction), gradation may be maximized in the first direction (x-axis direction). In this case, the density may be defined as an area or the number of insulating layers 118 per unit area. Gradation in the first direction (x-axis direction) may be maximized, by forming the insulating layer 118 having maximum density on one side in the first direction (x-axis direction), and reducing the density of the insulating layer 118 on the other side in the first direction (x-axis direction).

Figure 5A:
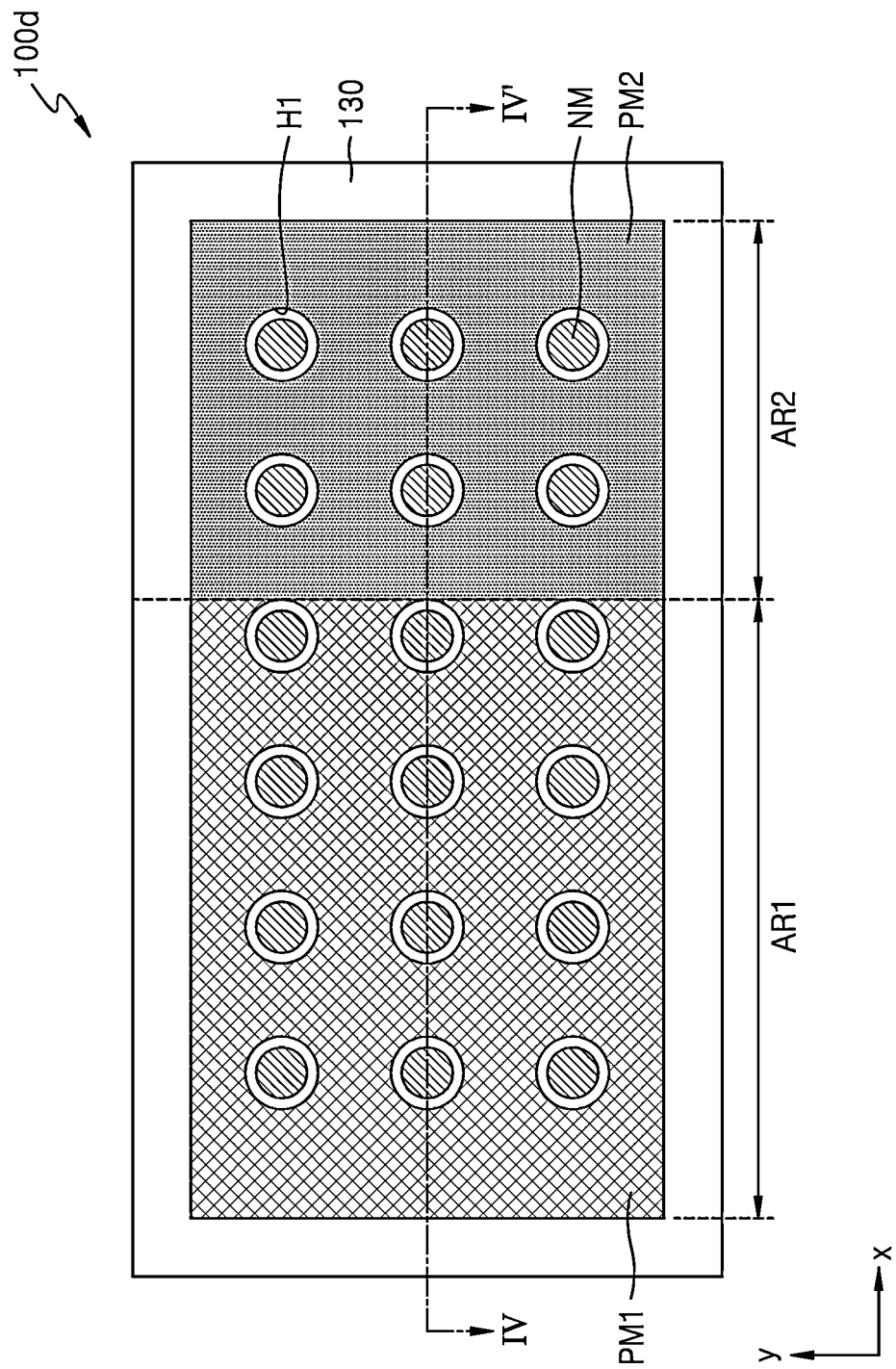
FIGS. 5A and 5B are respectively a plan view and a cross-sectional view of a semiconductor light emitting device, according to example embodiments.
Figure 5B:
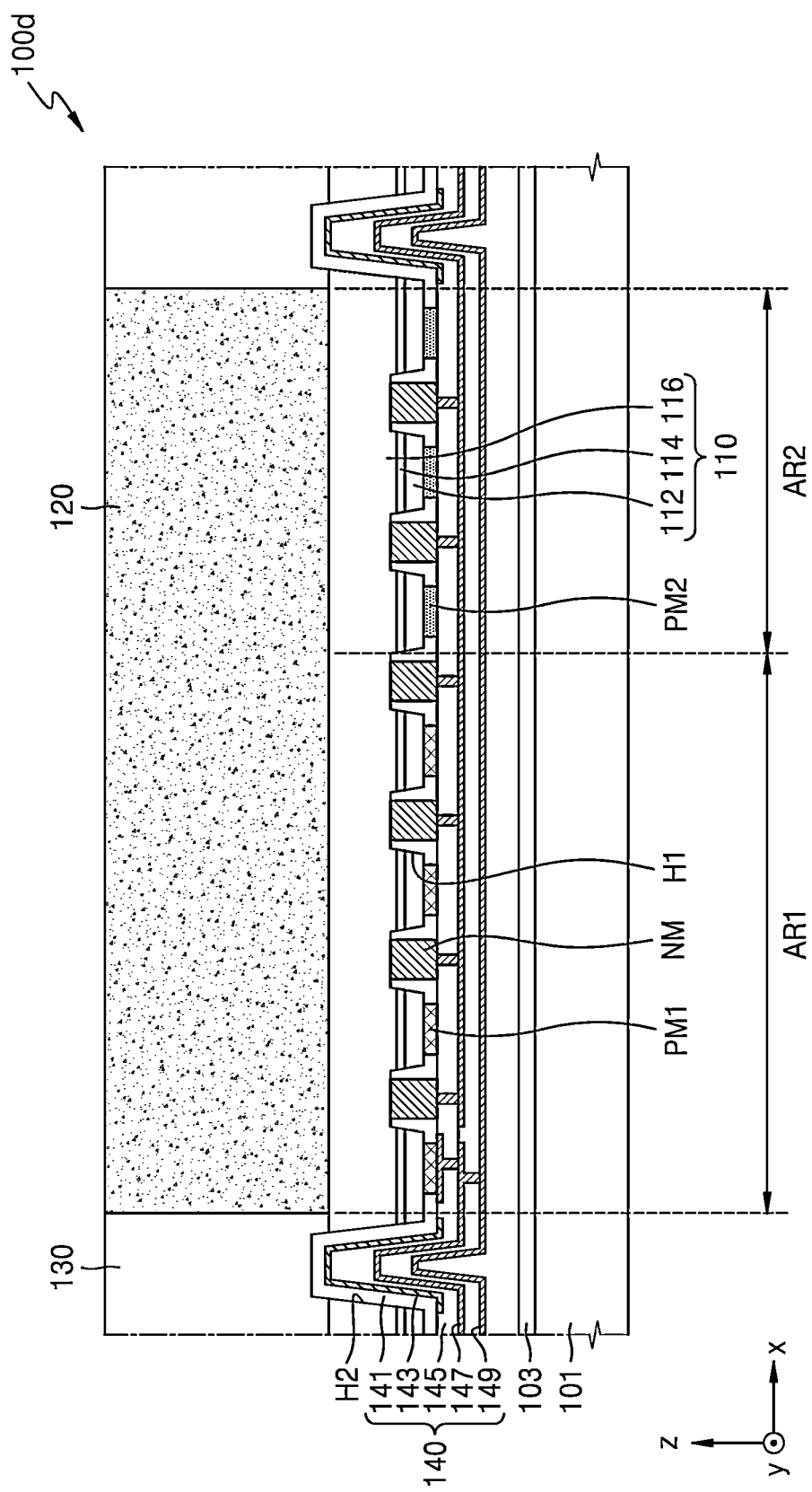

FIGS. 5A and 5B are respectively a plan view and a cross-sectional view of a semiconductor light emitting device 100d, according to example embodiments. FIG. 5A is a plan view viewed from the lower surface of the first electrode metal layers PM1 and PM2, and FIG. 5B is a cross-sectional view of a portion cut along line IV-IV' in FIG. 5A. The contents already described with reference to FIGS. 1A through 1C are briefly described or omitted.

Referring to FIGS. 5A and 5B, in the semiconductor light emitting device 100d according to the embodiment, the first electrode metal layer PM1 of the first region AR1 and the first electrode metal layer PM2 of the second region AR2 may have different metals from each other. In the first region AR1, the first electrode metal layer PM1 may include a metal material having a relatively high reflectivity. For example, the first electrode metal layer PM1 may include a metal material having a high reflectivity, such as Ag and Al. On the other hand, the first electrode metal layer PM2 of the second region AR2 may include a metal material having a relatively low reflectivity. For example, the first electrode metal layer PM2 may include a metal material having a low reflectivity, such as Al and Ti. In this case, reflectivity of the first electrode metal layer PM1 of the first region AR1 and the first electrode metal layer PM2 in the second region AR2 may be relative to each other. When the first electrode metal layer PM1 of the first region AR1 includes Ag, the first electrode metal layer PM2 of the second region AR2 may include Al, which has a lower reflectivity than Ag. When the first electrode metal layer PM1 of the first region AR1 includes Al, the first electrode metal layer PM2 of the second region AR2 may include Ti having a lower reflectivity than Al.

Because the reflectivity of the first electrode metal layer PM1 of the first region AR1 is higher than the reflectivity of the second electrode metal layer PM2 in the second region AR2, light emission of the first region AR1 may be maximized. As a result, in the semiconductor light emitting device 100d of the embodiment, the amount of light emitted from the first region AR1 due to the first electrode metal layer PM1 may be increased, and accordingly, the intensity of light emitted from the first region AR1 may be higher than that from the second region AR2, and thus, the first region AR1 may be relatively brighter and the second region AR2 may be relatively darker.

In the first region AR1, the central portion of the first electrode metal layer PM1 may be brightest, and the second region AR2 may become darker away from the first region AR1. Accordingly, gradation may be implemented, in which brightness gradually changes in the first direction (x-axis direction). In addition, by including a metal material, in which the reflectivity of the first electrode metal layers PM1 and PM2 gradually decreases in the first direction (x-axis direction), gradation may be maximized in the first direction (x-axis direction). For example, when a region is divided into three regions in the first direction (x-axis direction), a first electrode metal layer includes Ag in a first region, a first electrode metal layer includes Al in a second region, and a first electrode metal layer includes Ti in a third region, gradation may be more effectively implemented.

Figure 6A:
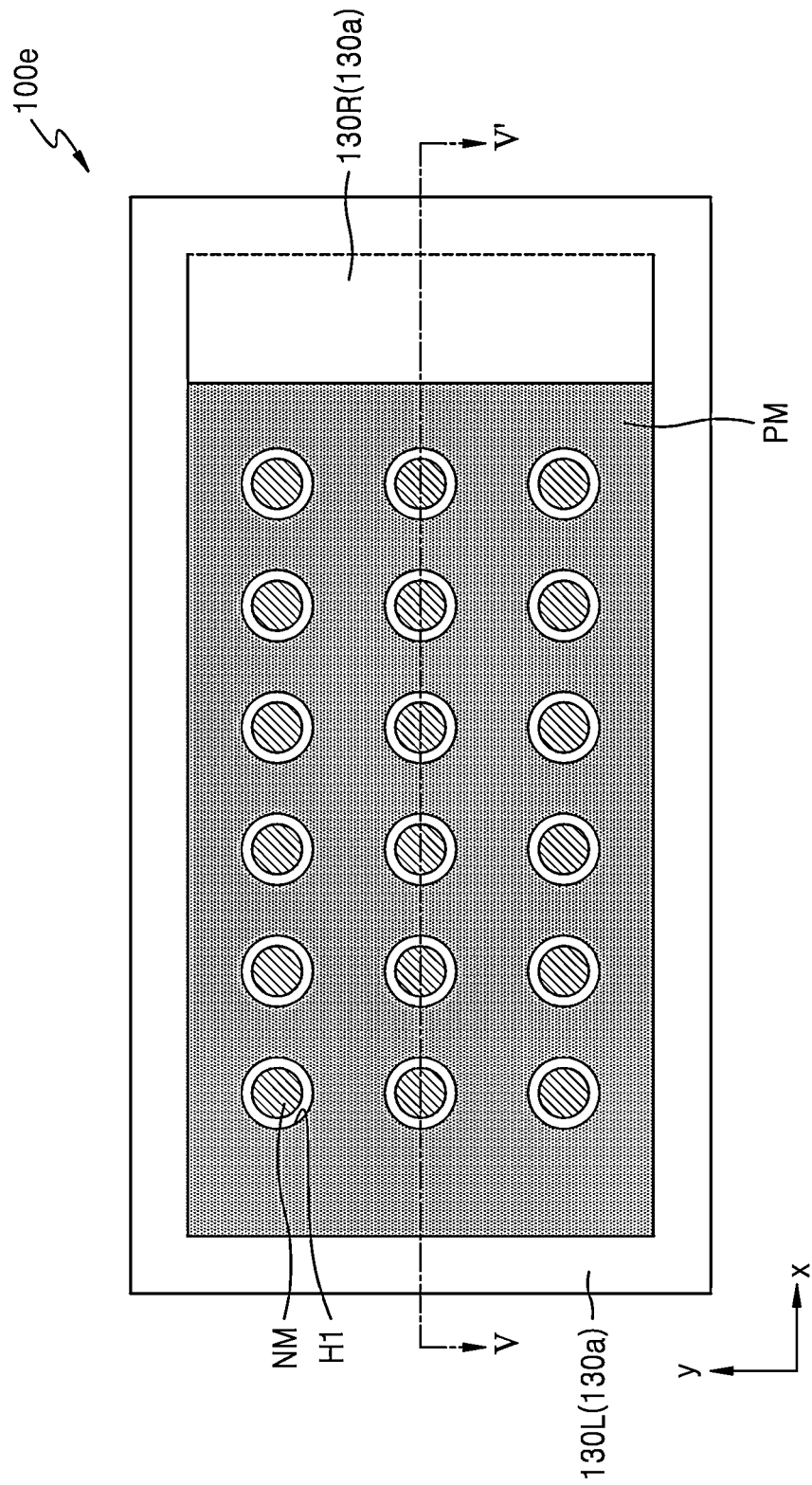
FIGS. 6A and 6B are respectively a plan view and a cross-sectional view of a semiconductor light emitting device, according to example embodiments.
Figure 6B:
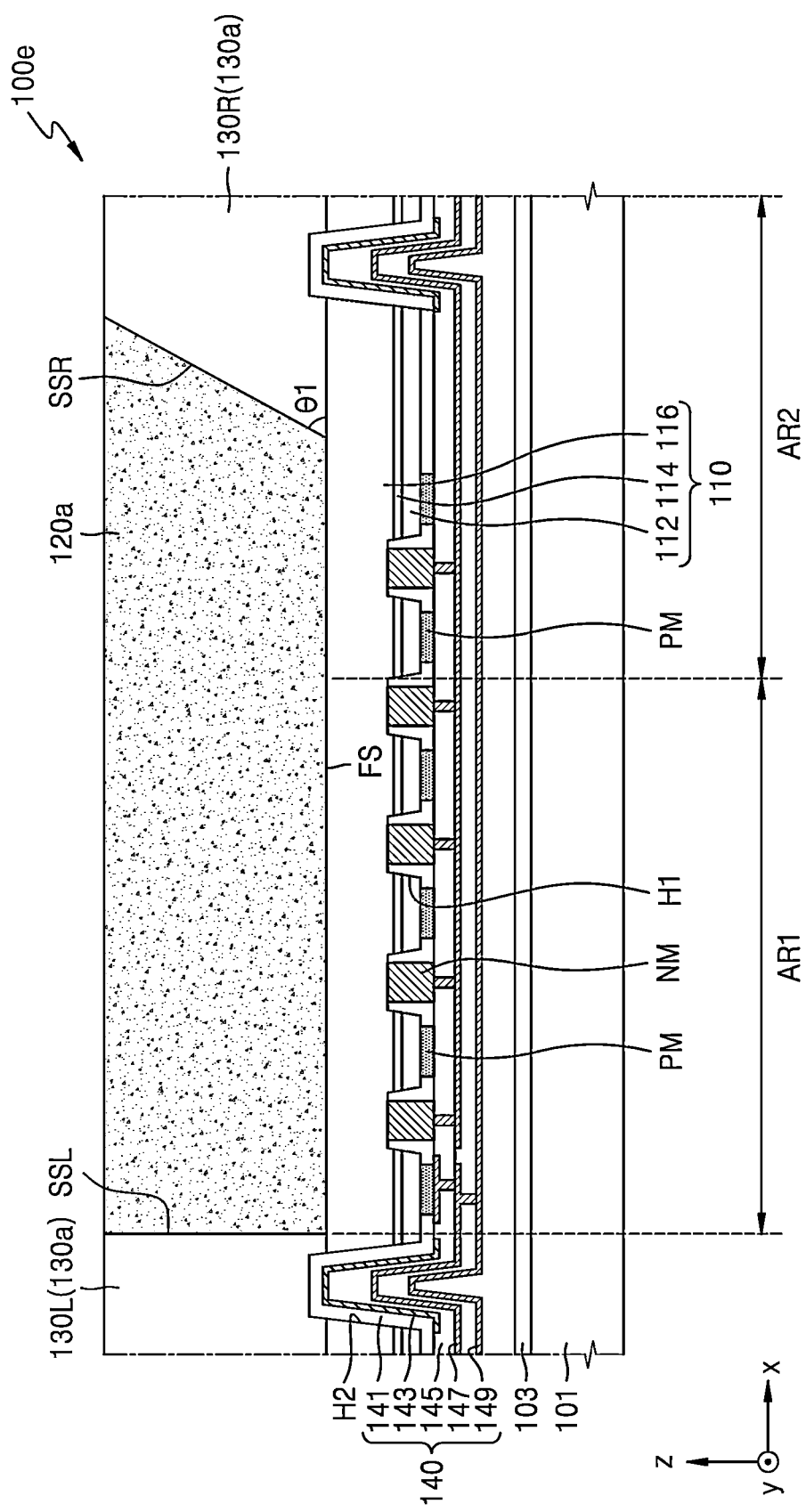

FIGS. 6A and 6B are respectively a plan view and a cross-sectional view of a semiconductor light emitting device 100e, according to example embodiments. FIG. 6A is a plan view viewed from the lower surface of the first electrode metal layer PM, and FIG. 6B is a cross-sectional view of a portion cut along line V-V' in FIG. 6A. The contents already described with reference to FIGS. 1A through 1C are briefly described or omitted.

Referring to FIGS. 6A and 6B, the semiconductor light emitting device 100e of the embodiment may be different from the semiconductor light emitting devices 100a through 100d of other embodiments, in a structure of the separation wall 130a. For example, in the semiconductor light emitting device 100e of the embodiment, structures of a left separation wall 130L may be different from a right separation wall 130R in the first direction (x-axis direction). An inner surface of the left separation wall 130L may have a structure perpendicular to an upper surface FS of the light emitting structure 110. An inner surface of the right separation wall 130R may have an inclination of a first angle θ1 with respect to the upper surface FS of the light emitting structure 110. For example, the first angle θ1 may be an acute angle of less than about 90°.

In general, by forming an inner surface of a separation wall perpendicular to the upper surface FS of the light emitting structure 110, the light emission efficiency of the light emitting structure 110 may be maximized. For example, when the inner surface of the separation wall is formed inclined with respect to the upper surface FS of the light emitting structure 110, light from the light emitting structure 110 may be spread and be emitted along a slope of the inner surface of the separation wall, and accordingly, the amount of light emitted per unit area may be reduced. As a result, in the semiconductor light emitting device 100e of the embodiment, the amount of light emitted from a portion adjacent to the left separation wall 130L may be greater than the amount of light emitted from a portion adjacent to the right separation wall 130R. As a result, by increasing intensity of the light emitted from the portion adjacent to the left separation wall 130L, gradation may be implemented, in which the portion adjacent to the left separation wall 130L is relatively brighter, and the portion adjacent to the right separation wall 130R is relatively darker.

By adjusting the inclination of the inner surface of the right separation wall 130R, the effect of gradation may be adjusted. For example, as the slope of the inner surface of the right separation wall 130R approaches about 0°, gradation may be maximized, in which the intensity of light emitted from the portion adjacent to the right separation wall 130R is minimized, and a brightness difference between the portion adjacent to the left separation wall 130L and the portion adjacent to the right separation wall 130R is maximized. As the slope of the inner surface of the right separation wall 130R is close to about 90°, a brightness difference between the portion adjacent to the left separation wall 130L and the portion adjacent to the right separation wall 130R may be minimized, and accordingly, the gradation may be minimized.

Figure 7A:
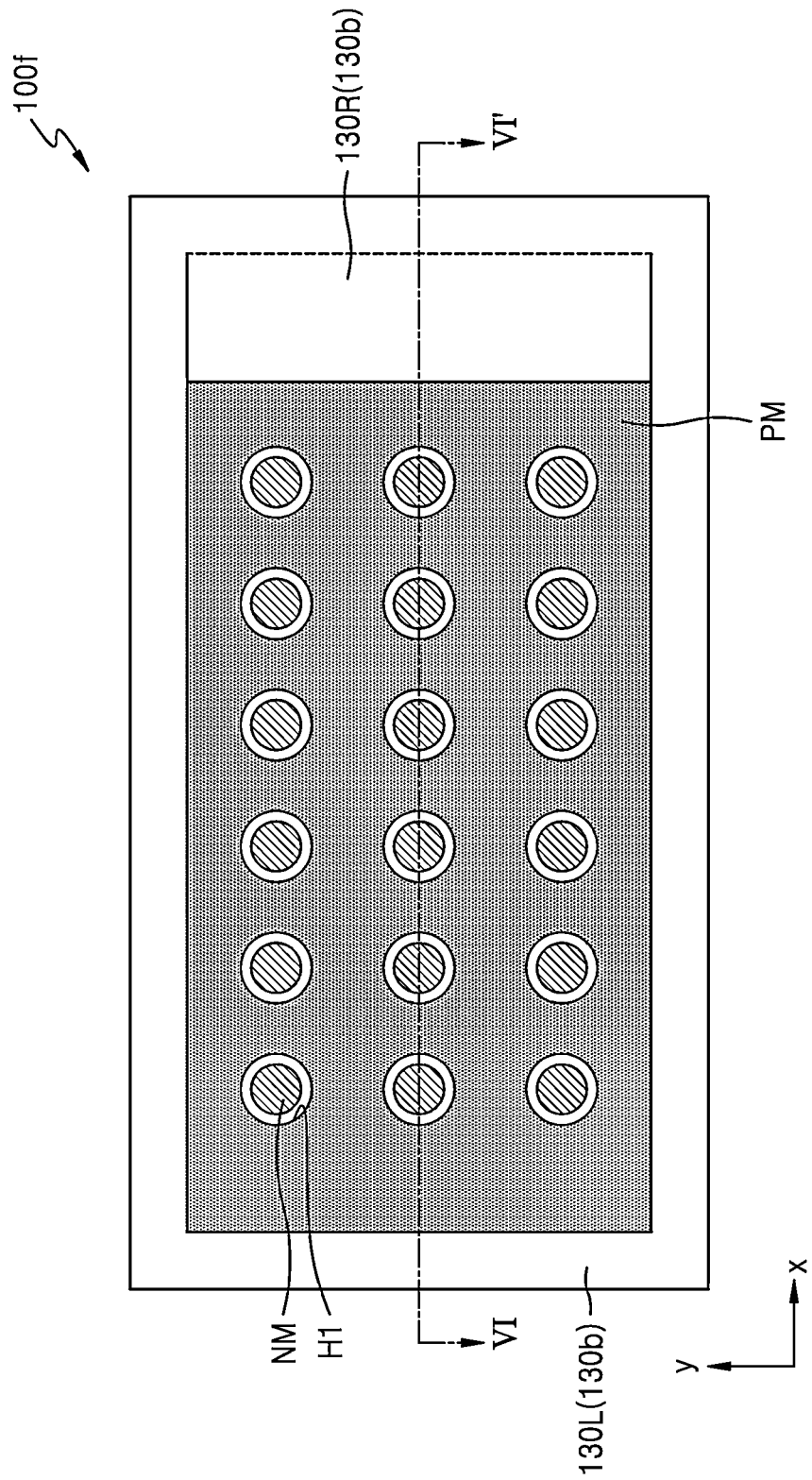
FIGS. 7A and 7B are respectively a plan view and a cross-sectional view of a semiconductor light emitting device, according to example embodiments.
Figure 7B:
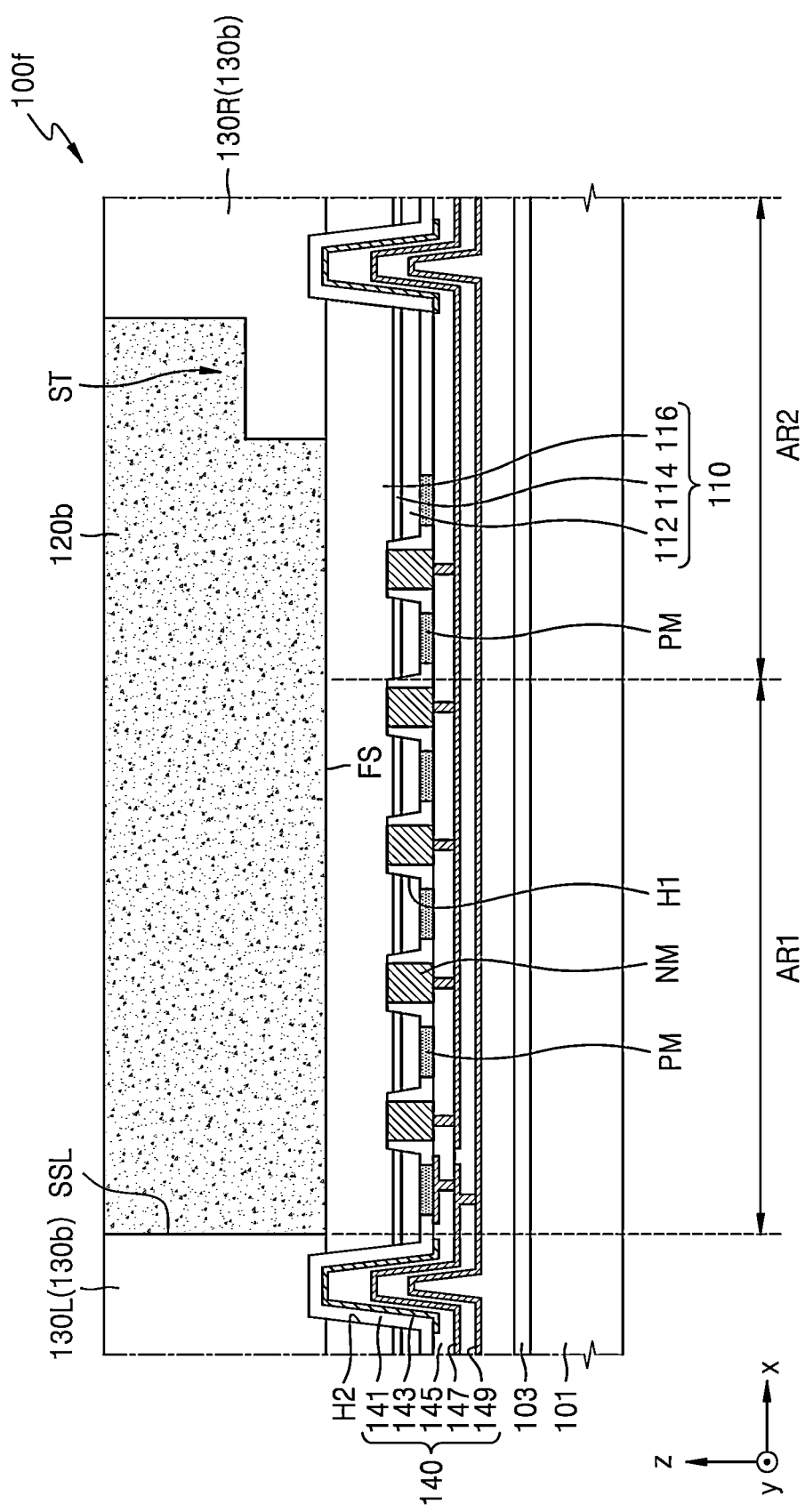

FIGS. 7A and 7B are respectively a plan view and a cross-sectional view of a semiconductor light emitting device 100f, according to example embodiments. FIG. 7A is a plan view viewed from the lower surface of the first electrode metal layer PM, and FIG. 7B is a cross-sectional view of a portion cut along line VI-VI' in FIG. 7A. The contents already described with reference to FIGS. 1A through 1C, 6A, and 6B are briefly described or omitted.

Referring to FIGS. 7A and 7B, the semiconductor light emitting device 100f of the embodiment may be different from the semiconductor light emitting devices 100a through 100d of other embodiments, in a structure of a separation wall 130b. In addition, the semiconductor light emitting device 100f of the embodiment may also be different from the semiconductor light emitting device 100e of FIG. 6B, in a structure of the right separation wall 130R. In the semiconductor light emitting device 100f according to the embodiment, the inner surface of the left separation wall 130L may have a structure perpendicular to the upper surface FS of the light emitting structure 110, but the inner surface of the right separation wall 130R may have a stepped structure. For example, a step ST may be formed on the inner surface of the right separation wall 130R.

Similar to the principle described above with respect to the separation wall 130a of the semiconductor light emitting device 100e of FIG. 6B, when the inner surface of the separation wall is formed in the stepped structure, light from the light emitting structure 110 may be spread and emitted according to the stepped structure of the inner surface of the separation wall, and accordingly, the amount of light emitted per unit area may be reduced. As a result, in the semiconductor light emitting device 100f of the embodiment, the amount of light emitted from a portion adjacent to the left separation wall 130L may be greater than the amount of light emitted from a portion adjacent to the right separation wall 130R. As a result, by increasing intensity of the light emitted from the portion adjacent to the left separation wall 130L, gradation may be implemented, in which the portion adjacent to the left separation wall 130L is relatively brighter, and the portion adjacent to the right separation wall 130R is relatively darker.

By variously adjusting the stepped structure of the inner surface of the right separation wall 130R, the effect of the gradation may be adjusted. For example, by forming many steps on the inner surface of the right separation wall 130R, or by increasing the width of the first layer portion in the first direction (x-axis direction) although one step is formed on the inner surface of the right separation wall 130R, the spread of light may be increased. For example, as the width of the first layer portion in the first direction (x-axis direction) of the right separation wall 130R is increased, gradation may be maximized, in which the intensity of light emitted from the portion adjacent to the right separation wall 130R is minimized, and a brightness difference between the portion adjacent to the left separation wall 130L and the portion adjacent to the right separation wall 130R is maximized. As the width of the first layer portion in the first direction (x-axis direction) of the right separation wall 130R is decreased, a brightness difference between the portion adjacent to the left separation wall 130L and the portion adjacent to the right separation wall 130R may be minimized, and accordingly, the gradation may be minimized.

Figure 8A:
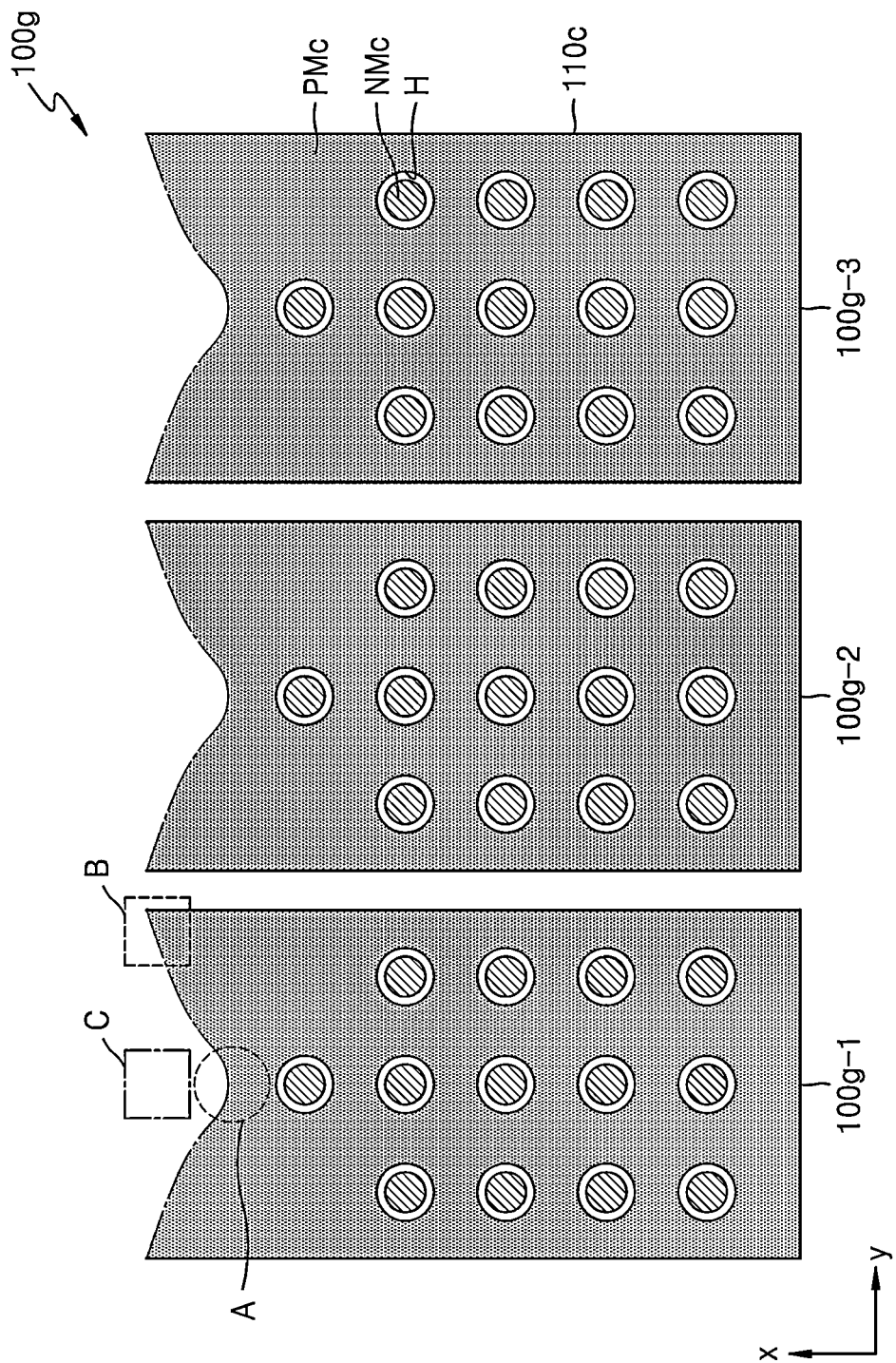
Figure 8B:
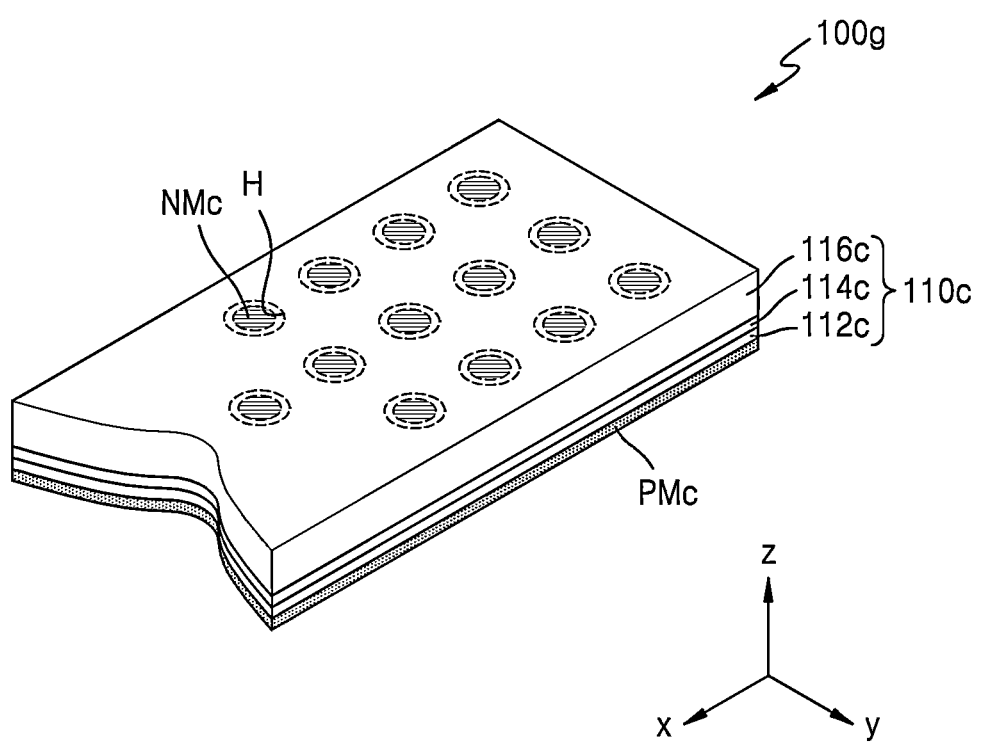

FIGS. 8A and 8C are plan views and FIG. 8B is a perspective view of a semiconductor light emitting device 100g, according to example embodiments. FIG. 8A and FIG. 8C are plan views viewed from lower surfaces of the first electrode metal layers PMc and PMd, respectively, and FIG. 8B is a perspective view of a light emitting structure portion of the semiconductor light emitting device 100g of FIG. 8A. The contents already given with reference to FIGS. 1A and 1B are briefly described or omitted.

Referring to FIGS. 8A and 8B, the semiconductor light emitting device 100g of the embodiment may be different from the semiconductor light emitting devices 100a through 100f of other embodiments, in a structure of a light emitting structure 110c. In the semiconductor light emitting device 100g of the embodiment, the light emitting structure 110c may have a structure, in which a central portion of the second direction (y-axis direction) is short in the first direction (x-axis direction) and both outer portions of the second direction (y-axis direction) are long in the first direction (x-axis direction).

The first electrode metal layer PMc may also have a shape corresponding to the light emitting structure 110c. For example, the first electrode metal layer PMc may have a structure, in which a central portion of the second direction (y-axis direction) is short in the first direction (x-axis direction) and both outer portions of the second direction (y-axis direction) are long in the first direction (x-axis direction). As illustrated in FIGS. 8A and 8B, through holes H and the second electrode metal layer NMc arranged therein may be arranged farther on the central portion of the second direction (y-axis direction) in the first direction (x-axis direction) and closer on both outer portions of the second direction (y-axis direction) in the first direction (x-axis direction), contrary to the structure of the light emitting structure 110c. Accordingly, a larger number of the through holes H and the second electrode metal layer NMc may be arranged on the central portion of the second direction (y-axis direction), and a less number thereof may be arranged on both outer portions of the second direction (y-axis direction).

The semiconductor light emitting device 100g of the embodiment may implement gradation in the first direction (x-axis direction) by using the structure of the light emitting structure 110c. To describe the gradation effect of the light emitting structure 110c in more detail, it may be assumed that when the through holes H and the second electrode metal layer NMc are arranged as illustrated in FIG. 8A, while the light emitting structure 110c has a rectangular shape like the light emitting structure 110a of the semiconductor light emitting device 100a of FIG. 2A. In the case of the light emitting structure 110c described above, the amount of light emitted from a first portion A indicated by a circle of a dashed line due to the through holes H arranged at the outermost side in the first direction (x-axis direction) and the second electrode metal layer NMc corresponding thereto may be relatively large, and an amount of light emitted from a second portion B indicated by a square of a dashed line may be small. In addition, when a third portion C indicated by a dash-dot line and the second portion B at the same position in the first direction (x-axis direction) are compared, an amount of light emitted from the third portion C may be more than that from the second portion B, due to the through holes H protruding on the central portion of the second direction (y-axis direction) and the corresponding second electrode metal layer NMc. Accordingly, even though gradation is implemented in the first direction (x-axis direction), imbalance due to different amounts of light may occur in the second direction (y-axis direction).

However, in the semiconductor light emitting device 100g of the embodiment, by forming the structure of the light emitting structure 110c as illustrated in FIG. 8A, the amount of light in the second direction (y-axis direction) may be reduced at the central portion of the second direction (y-axis direction), and thus, the amount of light in the second direction (y-axis direction) may be balanced in the first direction (x-axis direction). For example, the amounts of light emitted from the second portion B and the third portion C may be similar to each other. As a result, in the semiconductor light emitting device 100g of the embodiment, a uniform gradient may be implemented in the first direction (x-axis direction).

In the semiconductor light emitting device 100g of the embodiment, a horizontal cross-section of the wavelength converting layer on the light emitting structure 110c may have a structure corresponding to the light emitting structure 110c, or a rectangular shape as illustrated in other semiconductor light emitting devices 100a through 100f. When the horizontal cross-section of the wavelength converting layer has a structure corresponding to the light emitting structure 110c, the separation wall may have the same structure in both the light emitting structure 110c and the wavelength converting layer. For example, when the entire structure of the semiconductor light emitting device 100g of the embodiment has substantially the same structure as other semiconductor light emitting devices 100a through 100f, the separation wall may have a shape, in which a first direction (x-axis direction) width of the central portion in the second direction (y-axis direction) is relatively thick, and a first direction (x-axis direction) width of both outer portion in the second direction (Y direction) is relatively thin.

When a horizontal cross-section of the wavelength converting layer has a rectangular shape, the separation wall may have a stepped structure in the central portion in the second direction (y-axis direction). For example, a lower portion of the separation wall corresponding to the light emitting structure 110c may have a structure, in which a first direction (x-axis direction) width of the central portion in the second direction (y-axis direction) is relatively thick, and a first direction (x-axis direction) width of both outer portions in the second direction (y-axis direction) is relatively thin. In addition, the upper portions of the separation wall corresponding to the wavelength converting layer may have the same first direction (x-axis direction) width in the second direction (y-axis direction).

Referring to FIG. 8C, in a semiconductor light emitting device 100h of the embodiment, a light emitting structure 110d may have a structure opposite to the light emitting structure 110c of the semiconductor light emitting device 100g of FIG. 8A. In the semiconductor light emitting device 100h of the embodiment, the light emitting structure 110d may have a structure, in which a central portion of the second direction (y-axis direction) is long in the first direction (x-axis direction) and both outer portions of the second direction (y-axis direction) are short in the first direction (x-axis direction). In addition, a first electrode metal layer PMd may also have a shape corresponding to the light emitting structure 110d. As illustrated in FIG. 8C, the through holes H and the second electrode metal layer NMd arranged therein may be arranged closer on the central portion of the second direction (y-axis direction) in the first direction (x-axis direction) and farther on both outer portions of the second direction (y-axis direction), contrary to the structure of the light emitting structure 110d. Accordingly, a less number of the through holes H and the second electrode metal layer NMd may be arranged on the central portion of the second direction (y-axis direction), and a larger number thereof may be arranged on both outer portions of the second direction (y-axis direction).

The semiconductor light emitting device 100h of the embodiment may uniformly implement gradation in the first direction (x-axis direction) by using the structure of the light emitting structure 110d. The uniform gradation effect in the semiconductor light emitting device 100h of the embodiment may be the same as the descriptions given with reference to FIG. 8A. For example, in the semiconductor light emitting device 100h of the embodiment, by forming the structure of the light emitting structure 110d as illustrated in FIG. 8C, the amount of light of the second direction (y-axis direction) may be reduced at both outside portions of the second direction (y-axis direction), and accordingly, the amount of light of the second direction (y-axis direction) may be balanced in the first direction (x-axis direction). For example, the amount of light emitted from the second portion B and the third portion C may be similar to each other. As a result, in the semiconductor light emitting device 100h of the embodiment, a uniform gradient may be implemented in the first direction (x-axis direction).

In the semiconductor light emitting device 100h of the embodiment, a horizontal cross-section of the wavelength converting layer on the light emitting structure 110d may have a structure corresponding to the light emitting structure 110d, or a rectangular shape as illustrated in other semiconductor light emitting devices 100a through 100f. When the horizontal cross-section of the wavelength converting layer has a structure corresponding to the light emitting structure 110d, the separation wall may have the same structure in both the light emitting structure 110d and the wavelength converting layer. When a horizontal cross-section of the wavelength converting layer has a rectangular shape, the separation wall may have a stepped structure in the both outside portions of the second direction (y-axis direction). For example, lower portion of the separation wall corresponding to the light emitting structure 110c may have a structure, in which a first direction (x-axis direction) width of the both outside portions in the second direction (y-axis direction) is relatively thick, and a first direction (x-axis direction) width of the central portion of the second direction (y-axis direction) is relatively thin. In addition, the upper portions of the separation wall corresponding to the wavelength converting layer may have the same first direction (x-axis direction) width in the second direction (y-axis direction).

Figure 9A:
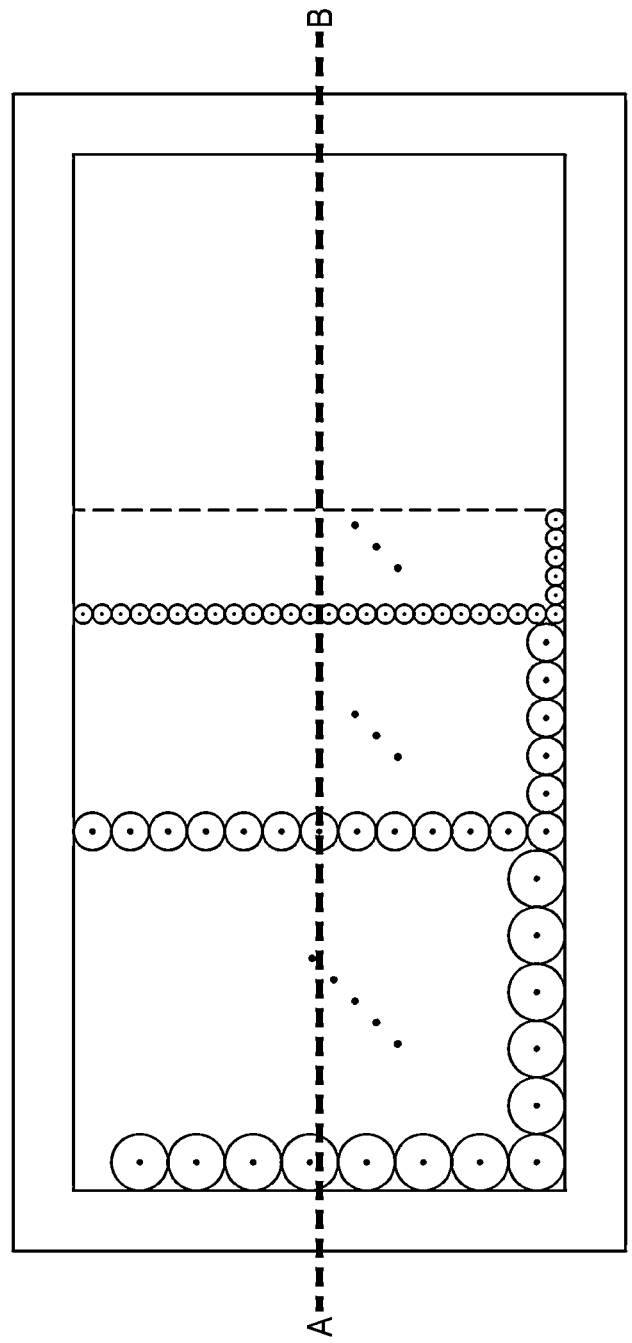
FIGS. 9A and 9B are graphs illustrating a semiconductor light emitting device of FIG. 3A and a gradation effect thereof, respectively.
Figure 9B:
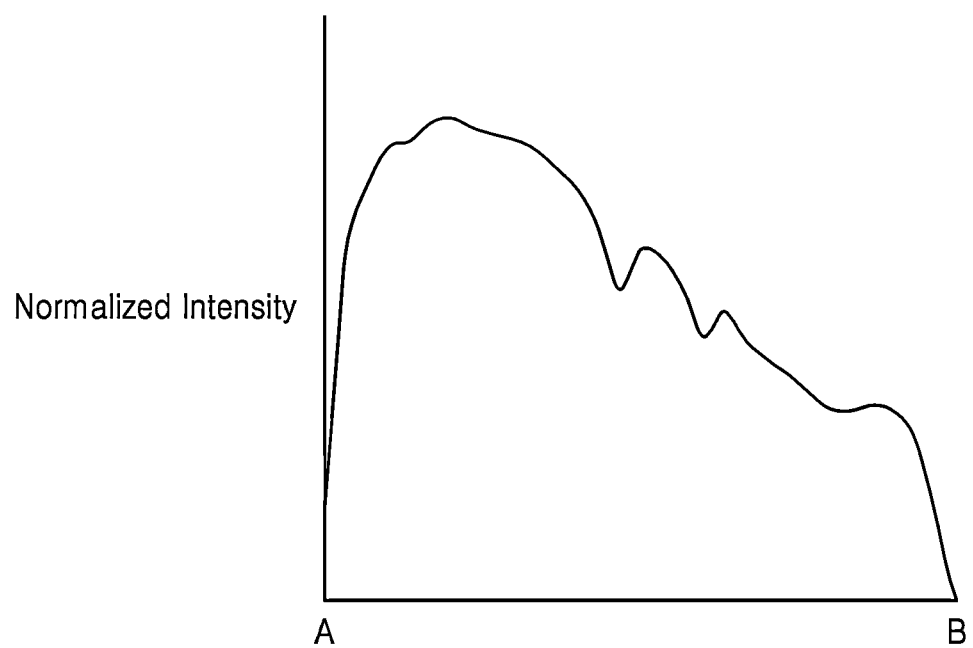

FIGS. 9A and 9B are graphs illustrating the semiconductor light emitting device 100b of FIG. 3A and a gradation effect thereof, respectively. In the graph of FIG. 9B, the x-axis may represent a position corresponding to line A-B, and the y-axis may represent normalized intensity of emitted light.

Referring to FIGS. 9A and 9B, from the graph of FIG. 9B, implementation of gradation from portion A to portion B may be identified. For example, the intensity of light may be highest in a portion adjacent to the portion A, decrease away from the portion A, and be lowest at a portion close to the portion B.

FIGS. 10A through 10D are plan views of light emitting device assemblies including semiconductor light emitting devices, according to example embodiments. Descriptions are given with reference to FIGS. 2A through 8C together, and the contents already given with reference to FIGS. 1A through 9B are briefly described or omitted.

Figure 10A:
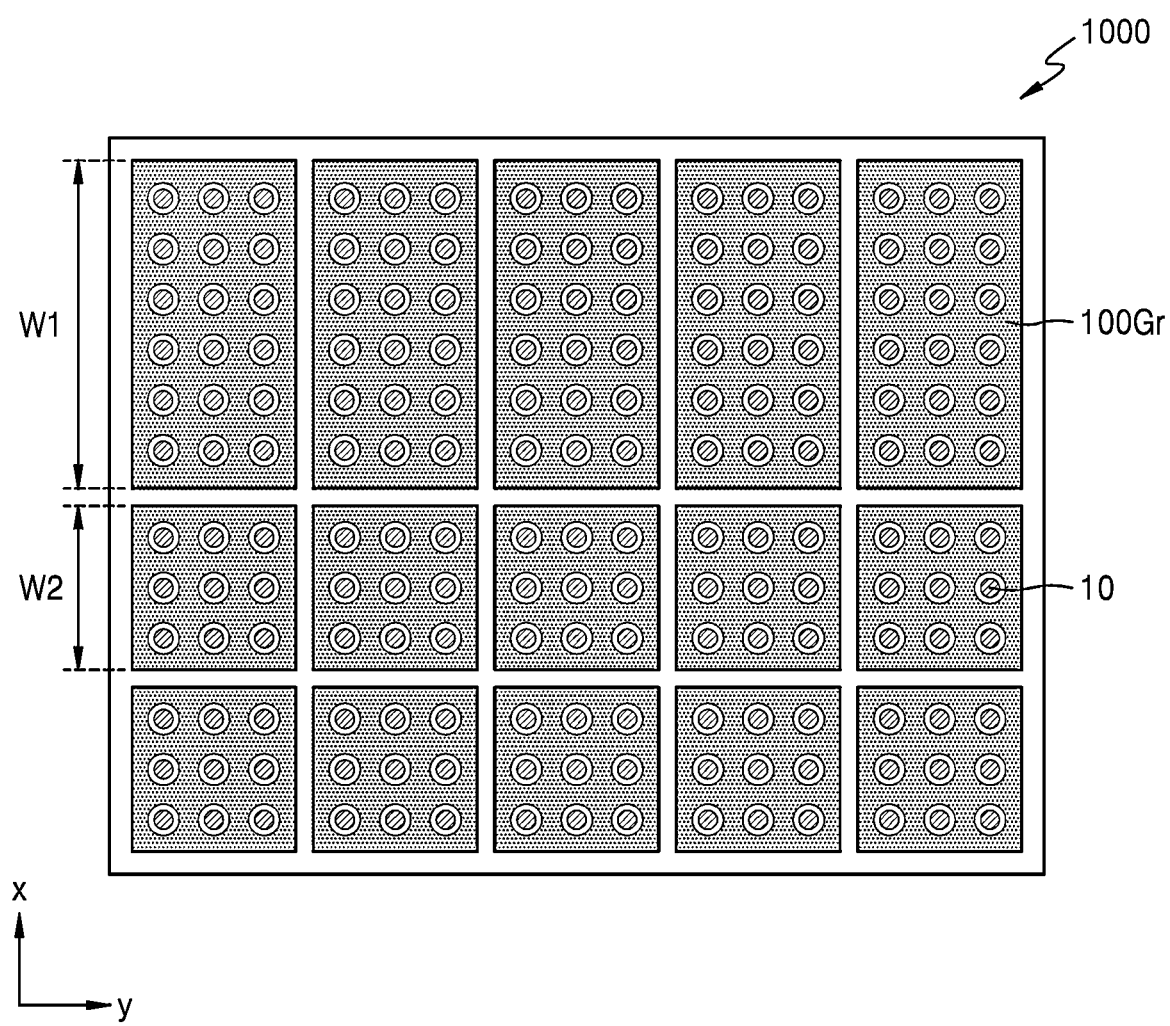
FIGS. 10A, 10B, 10C, and 10D are plan views of light emitting device assemblies including semiconductor light emitting devices, according to example embodiments.

Referring to FIG. 10A, a light emitting device assembly 1000 including semiconductor light emitting devices according to an embodiment of the embodiment may include a plurality of semiconductor light emitting devices 100Gr and 10. The plurality of semiconductor light emitting devices 100Gr and 10 may be arranged in a two-dimensional array structure, and may include gradation semiconductor light emitting devices 100Gr and non-gradation semiconductor light emitting devices 10. Each of the gradation semiconductor light emitting devices 100Gr may include any one of the semiconductor light emitting devices 100a, 100b, and 100d of FIGS. 2A, 3A, and 5A. For example, in the light emitting device assembly 1000 of the embodiment, each of the gradation semiconductor light emitting devices 100Gr may include the semiconductor light emitting device 100b of FIG. 3A.

In the light emitting device assembly 1000 of the embodiment, the gradation and non-gradation semiconductor light emitting devices 100Gr and 10 may be arranged in a two-dimensional array structure of three rows and five columns. For example, the non-gradation semiconductor light emitting devices 10 may be arranged on a first row and a second row, and the gradation semiconductor light emitting devices 100Gr may be arranged on a third row. In this case, a column direction, that is, the first direction (x-axis direction) may be a direction, in which the gradation effect is implemented. Each of the gradation semiconductor light emitting devices 100Gr may have a first width W1 in the first direction (x-axis direction), and each of the non-gradation semiconductor light emitting devices 10 may have a second width W2 in the first direction (x-axis direction). As illustrated in FIG. 10A, the first width W1 may be greater than the second width W2. For example, the first width W1 may be twice or more than the second width W2. However, a size of the first width W1 is not limited to twice or more than that of the second width W2.

In the light emitting device assembly 1000 of the embodiment, the two-dimensional array structure is not limited to a structure of three rows and five columns. For example, in the light emitting device assembly 1000 of the embodiment, the two-dimensional array structure may include two or less rows, or four or more rows. In addition, the two-dimensional array structure may also include 4 columns or less, or 6 columns or more. In addition, although the non-gradation semiconductor light emitting devices 10 have a shape close to a square, the non-gradation semiconductor light emitting devices 10 may have a rectangular shape elongated in the first direction (x-axis direction), similar to the gradation semiconductor light emitting devices 100Gr.

Figure 10B:
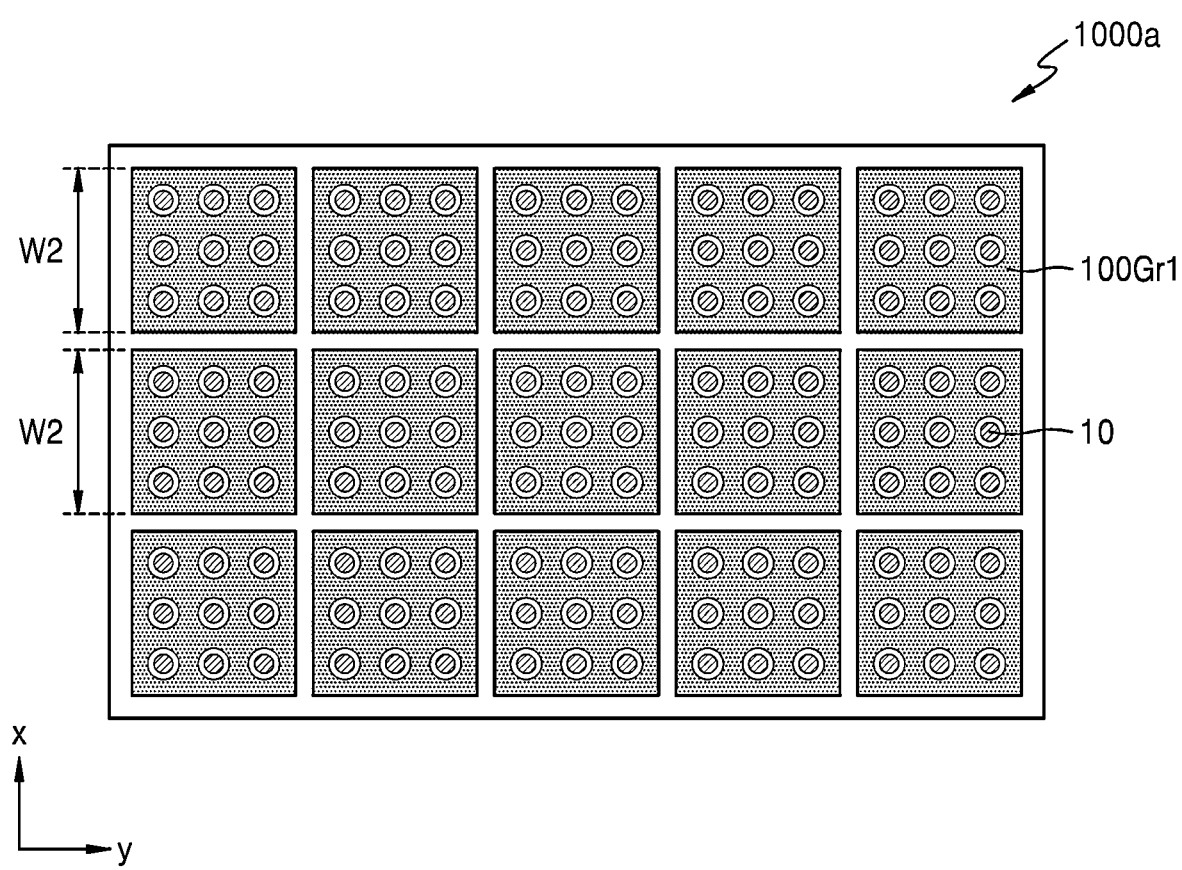

Referring to FIG. 10B, a light emitting device assembly 1000a of the embodiment may be similar to the light emitting device assembly 1000 of FIG. 10A, in that a plurality of semiconductor light emitting devices 100Gr1 and 10 are arranged in a two-dimensional array structure of three rows and five columns. However, in the light emitting device assembly 1000a of the present embodiment, the first direction (x-axis direction) widths of the gradation semiconductor light emitting device 100Gr1 and the non-gradation semiconductor light emitting device 10 may be substantially the same, which may be different from the light emitting device assembly 1000 of FIG. 10A. Each of the gradation semiconductor light emitting devices 100Gr may have the second width W2 in a first direction (x-axis direction). In addition, each of the non-gradation semiconductor light emitting devices 10 may have the second width W2 in the first direction (x-axis direction). Furthermore, although the gradation semiconductor light emitting devices 100Gr1 and 10 have a shape close to a square, according to an embodiment, the gradation semiconductor light emitting devices 100Gr1 and 10 may have a rectangular shape elongated in the first direction (x-axis direction).

Figure 10C:
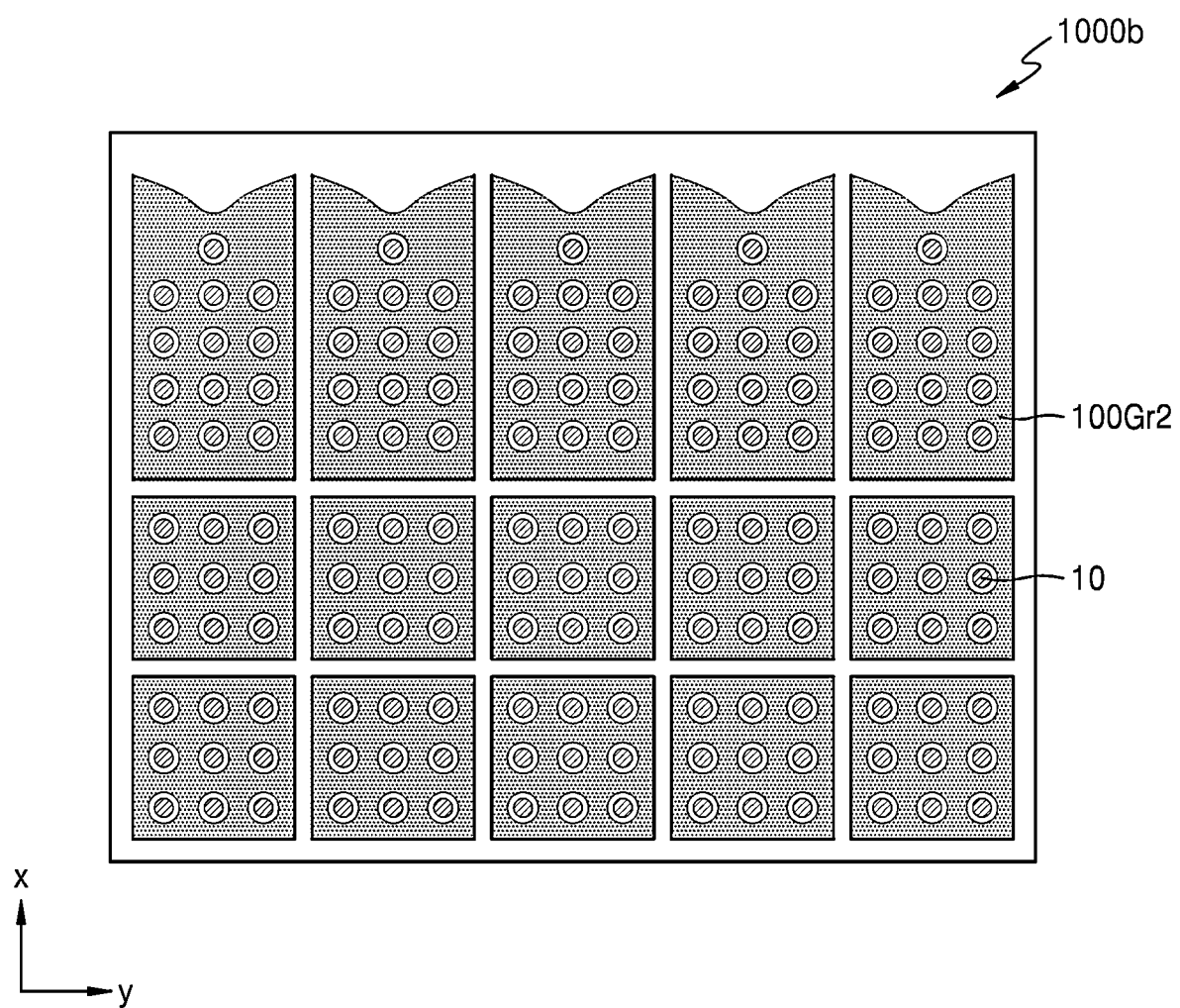

Referring to FIG. 10C, a light emitting device assembly 1000b of the embodiment may be similar to the light emitting device assembly 1000 of FIG. 10A, in that a plurality of gradation semiconductor light emitting devices 100Gr2 and 10 are included and arranged in a two-dimensional array structure of three rows and five columns. However, the light emitting device assembly 1000b of the embodiment may be different from the light emitting device assembly 1000 of FIG. 10A, in that each of the gradation semiconductor light emitting devices 100Gr2 has a structure of the semiconductor light emitting device 100g of FIG. 8A. Considering a principle aspect of gradation, in a light emitting device assembly 1000c of the embodiment, each of the gradation semiconductor light emitting devices 100Gr2 may have a structure of the semiconductor light emitting device 100h of FIG. 8C instead of the semiconductor light emitting device 100g of FIG. 8A.

Figure 10D:
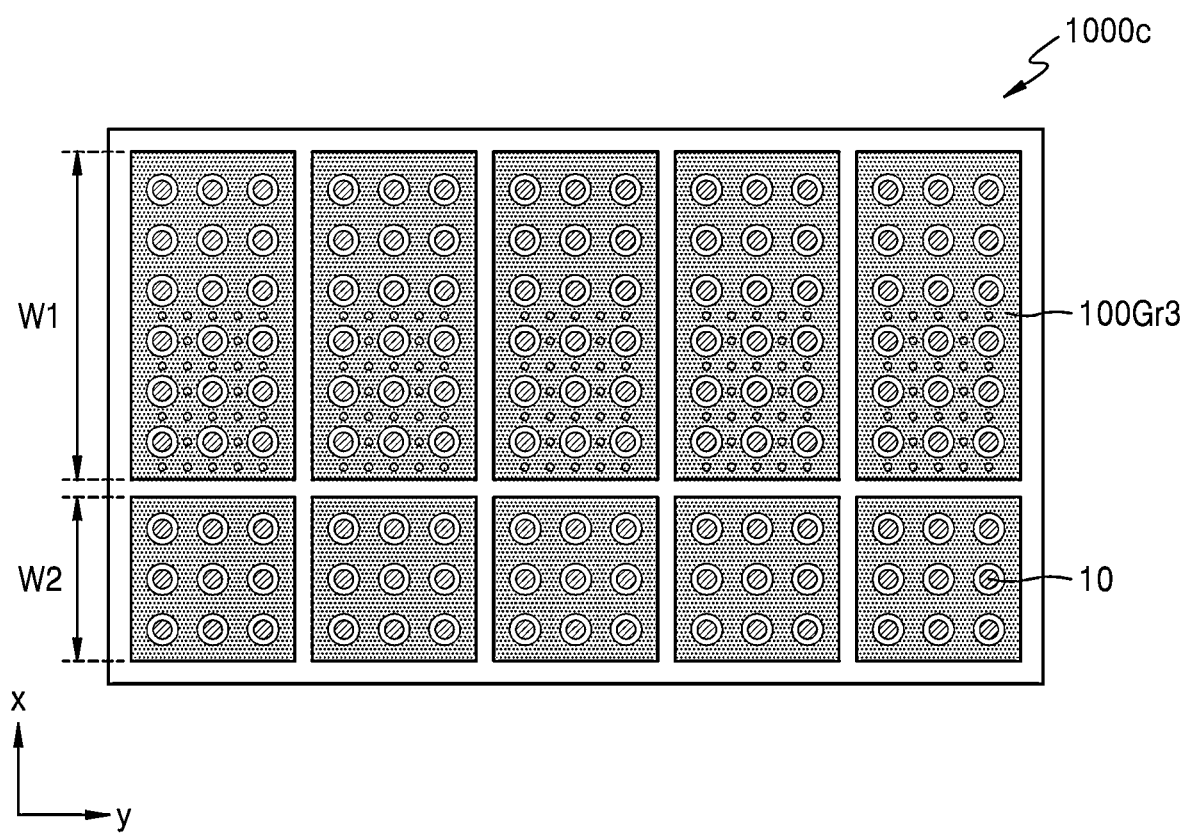

Referring to FIG. 10D, the light emitting device assembly 1000c of the embodiment may be different from the light emitting device assembly 1000 of FIG. 10A, in that a plurality of gradation semiconductor light emitting devices 100Gr3 and 10 are included and arranged in a two-dimensional array structure of two rows and five columns. In addition, the light emitting device assembly 1000c of the embodiment may be different from the light emitting device assembly 1000 of FIG. 10A, in that each of the gradation semiconductor light emitting devices 100Gr3 has a structure of the semiconductor light emitting device 100c of FIG. 4A. Considering a principle aspect of gradation, in the light emitting device assembly 1000c of the embodiment, each of the gradation semiconductor light emitting devices 100Gr3 may have a structure of the semiconductor light emitting device 100d of FIG. 5A instead of the semiconductor light emitting device 100c of FIG. 4A.

The semiconductor light emitting devices 100a, 100b, 100c, 100d, 100g, and 100h of FIGS. 2a, 3a, 4a, 5a, 8a, and 8c, respectively, have been described as gradient semiconductor light emitting devices employed in a light emitting device assembly. However, the embodiments are not limited thereto, and the semiconductor light emitting devices 100e or 100f of FIG. 6A or 7A, respectively, may be employed as the gradient semiconductor light emitting devices of the light emitting device assembly.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor light emitting device comprising:
a base layer;
a light emitting structure comprising a first semiconductor layer having a first conductivity, an active layer, and a second semiconductor layer having a second conductivity different from the first conductivity, the first semiconductor layer, the active layer, and the second semiconductor layer being sequentially disposed on the base layer;
a wavelength converting layer on the light emitting structure;
a separation wall disposed adjacent to side surfaces of the wavelength converting layer;
a first electrode metal layer on a lower surface of the first semiconductor layer, the first electrode metal layer comprising a reflection structure; and
a second electrode metal layer electrically connected to the second semiconductor layer via through holes penetrating the first electrode metal layer, the first semiconductor layer, and the active layer, and exposing the second semiconductor layer,
wherein the semiconductor light emitting device is configured to implement gradation in a first direction based on adjusting at least one of the light emitting structure on an upper surface of the second semiconductor layer, the reflection structure, the separation wall, and a structure included in the light emitting structure.

2. The semiconductor light emitting device of claim 1, wherein the light emitting structure further comprises a plurality of cones, and
wherein a size of each of the plurality of cones decreases in the first direction.

3. The semiconductor light emitting device of claim 1, wherein the light emitting structure further comprises a plurality of cones, and
wherein a density of each of the plurality of cones decreases in the first direction.

4. The semiconductor light emitting device of claim 1, wherein the first electrode metal layer comprises a first region and a second region in the first direction,
wherein the reflection structure comprises a multilayer comprising an insulating layer and a metal layer in the first region, and a single layer of a metal layer in the second region, and
wherein the insulating layer comprises an omni-directional reflector (ODR) structure or a distributed Bragg reflector (DBR) structure.

5. The semiconductor light emitting device of claim 1, wherein the first electrode metal layer comprises a first region and a second region in the first direction,
wherein the reflection structure comprises a first metal material layer in the first region, and a second metal material layer in the second region, and
wherein a reflectivity of the first metal material layer is greater than a reflectivity of the second metal material layer.

6. The semiconductor light emitting device of claim 1, wherein the separation wall comprises a first separation wall disposed on a first side of the separation wall in the first direction and perpendicular to an upper surface of the light emitting structure, and a second separation wall disposed on a second side of the separation wall in the first direction and inclined with respect to the upper surface of the light emitting structure.

7. The semiconductor light emitting device of claim 1, wherein the separation wall comprises a first separation wall disposed on a first side of the separation wall in the first direction and perpendicular to an upper surface of the light emitting structure, and a second separation wall disposed on a second side of the separation wall in the first direction and having a step shape.

8. The semiconductor light emitting device of claim 1, wherein a central portion of the light emitting structure in a second direction perpendicular to the first direction has a first length in the first direction, and
wherein through holes in the central portion in the second direction are disposed farther away in the first direction than through holes in outer portions in the second direction.

9. The semiconductor light emitting device of claim 1, wherein a central portion of the light emitting structure in a second direction perpendicular to the first direction has a second length in the first direction, and
wherein the through holes in outer portions in the second direction are disposed farther away in the first direction than through holes in a central portion in the second direction.

10. A semiconductor light emitting device comprising:
a base layer;
a light emitting structure comprising a first semiconductor layer having a first conductivity, an active layer, and a second semiconductor layer having a second conductivity different from the first conductivity, the first semiconductor layer, the active layer, and the second semiconductor layer being sequentially disposed on the base layer;
a wavelength converting layer on the light emitting structure;
a separation wall disposed adjacent to side surfaces of the wavelength converting layer;
a first electrode metal layer on a lower surface of the first semiconductor layer; and
a second electrode metal layer electrically connected to the second semiconductor layer via through holes penetrating the first electrode metal layer, the first semiconductor layer, and the active layer, and exposing the second semiconductor layer,
wherein the semiconductor light emitting device is configured to implement gradation in a first direction based on adjusting an amount of light emitted from the light emitting structure on an upper surface of the second semiconductor layer or adjusting the separation wall.

11. The semiconductor light emitting device of claim 10, wherein the gradation is implemented based on adjusting the light emitting structure,
wherein the light emitting structure comprises a plurality of cones, and
wherein in the first direction, a size of each of the plurality of cones decreases or a density of each of the plurality of cones decreases.

12. The semiconductor light emitting device of claim 10, wherein the gradation is implemented based on adjusting the separation wall, and
wherein the separation wall comprises a first separation wall disposed on a first side of the separation wall in the first direction and perpendicular to an upper surface of the light emitting structure, and a second separation wall disposed on a second side of the separation wall and inclined with respect to the upper surface of the light emitting structure or having a step shape.

13. A light emitting device assembly comprising:
a mounting substrate; and
a plurality of semiconductor light emitting devices disposed on the mounting substrate in a two-dimensional array,
wherein the semiconductor light emitting devices comprises gradation semiconductor light emitting devices and non-gradation semiconductor light emitting devices, and
wherein each of the gradation semiconductor light emitting devices comprises:
    a base layer;
    a light emitting structure comprising a first semiconductor layer having a first conductivity, an active layer, and a second semiconductor layer having a second conductivity different from the first conductivity, the first semiconductor layer, the active layer, and the second semiconductor layer being sequentially disposed on the base layer;
    a wavelength converting layer on the light emitting structure;
    a separation wall disposed adjacent to side surfaces of the wavelength converting layer;
    a first electrode metal layer on a lower surface of the first semiconductor layer, the first electrode metal layer comprising a reflection structure; and
    a second electrode metal layer electrically connected to the second semiconductor layer via through holes penetrating the first electrode metal layer, the first semiconductor layer, and the active layer, and exposing the second semiconductor layer, and
    wherein each of the gradation semiconductor light emitting devices are configured to implement gradation in a first direction based on adjusting at least one of the light emitting structure on an upper surface of the second semiconductor layer, the reflection structure, the separation wall, and a structure included in the light emitting structure.

14. The light emitting device assembly of claim 13, wherein the two-dimensional array comprises a structure in which m, where m is an integer of two or more, semiconductor light emitting devices are disposed in the first direction, and n, where n is an integer of two or more, semiconductor light emitting devices are disposed in a second direction perpendicular to the first direction,
    wherein the non-gradation semiconductor light emitting devices are disposed up to an $(m-1)^{th}$ row in the first direction, and
    wherein the gradation semiconductor light emitting devices are arranged on an $m^{th}$ row in the first direction.

15. The light emitting device assembly of claim 13, wherein a width of the gradation semiconductor light emitting devices is greater than a width of the non-gradation semiconductor light emitting devices in the first direction.

16. The light emitting device assembly of claim 13, wherein each of the gradation semiconductor light emitting devices comprises a structure in which an amount of light emitted from the light emitting structure is adjusted to implement the gradation.

17. The light emitting device assembly of claim 16, wherein a plurality of cones on an upper surface of the second semiconductor layer are configured to implement gradation, and
    wherein, in the first direction, a size of each of the plurality of cones decreases or a density of each of the plurality of cones decreases.

18. The light emitting device assembly of claim 16, wherein the gradation is implemented based on adjusting the separation wall, and
    wherein the separation wall comprises a first separation wall disposed on a first side of the separation wall in the first direction and perpendicular to an upper surface of the light emitting structure, and a second separation wall disposed on a second side of the separation wall and inclined with respect to the upper surface of the light emitting structure or having a step shape.

19. The light emitting device assembly of claim 16, wherein the gradation is implemented based on adjusting the reflection structure,
    wherein the first electrode metal layer comprises a first region and a second region in the first direction,
    wherein the reflection structure of the first electrode metal layer comprises a multilayer of an insulating layer and a metal layer of the first region, and a single layer of a metal layer of the second region, or comprises a first metal material layer of the first region and a second metal material layer of the second region, and
    wherein a reflectivity of the first metal material layer is greater than a reflectivity of the second metal material layer.

20. The light emitting device assembly of claim 16, wherein the gradation is implemented based on adjusting the structure included in the light emitting structure,
    wherein a central portion of the light emitting structure in a second direction perpendicular to the first direction has a first length or a second length in the first direction, the first length being shorter than the second length,
    wherein, based on the light emitting structure having the first length in the first direction, through holes in a central portion of the second direction are disposed farther away in the first direction than through holes in outer portions of the second direction, and
    wherein, based on the light emitting structure having the second length in the first direction, through holes in the outer portions of the second direction are disposed farther away in the first direction than through holes in the central portion of the second direction.

* * * * *